US011127574B2

United States Patent
Kawamata et al.

(10) Patent No.: US 11,127,574 B2
(45) Date of Patent: Sep. 21, 2021

(54) PLASMA PROCESSING APPARATUS

(71) Applicant: SHIBAURA MECHATRONICS CORPORATION, Yokohama (JP)

(72) Inventors: Yoshio Kawamata, Yokohama (JP); Yu Kambe, Yokohama (JP)

(73) Assignee: SHIBAURA MECHATRONICS CORPORATION, Yokohama (JP)

( * ) Notice: Subject to any disclaimer, the term of this patent is extended or adjusted under 35 U.S.C. 154(b) by 427 days.

(21) Appl. No.: 15/941,853

(22) Filed: Mar. 30, 2018

(65) Prior Publication Data
US 2018/0286645 A1 Oct. 4, 2018

(30) Foreign Application Priority Data
Mar. 31, 2017 (JP) .............................. JP2017-073050

(51) Int. Cl.
*H01J 37/34* (2006.01)
*H01J 37/32* (2006.01)
(Continued)

(52) U.S. Cl.
CPC ........ *H01J 37/3411* (2013.01); *C23C 14/505* (2013.01); *C23C 14/568* (2013.01);
(Continued)

(58) Field of Classification Search
CPC ............. H01J 37/3411; H01J 37/32779; H01J 37/32715; H01J 37/321; H01J 37/32761; H01J 37/3447; H01J 37/3438; H01J 37/32532; H01J 37/32568; H01J 37/34; C23C 14/505; C23C 14/568;
(Continued)

(56) References Cited

U.S. PATENT DOCUMENTS

| 6,162,323 A * | 12/2000 | Koshimizu | ......... H01J 37/3244 |
|---|---|---|---|
| | | | 156/345.26 |
| 2004/0182701 A1* | 9/2004 | Miyamura | ............ C23C 14/568 |
| | | | 204/298.26 |

(Continued)

FOREIGN PATENT DOCUMENTS

| JP | 3586198 B2 | 11/2004 |
|---|---|---|
| JP | 4428873 B2 | 12/2009 |
| TW | 201542041 A | 11/2015 |

*Primary Examiner* — Michael A Band
(74) *Attorney, Agent, or Firm* — Nath, Goldberg & Meyer; Jerald L. Meyer

(57) ABSTRACT

A plasma processing apparatus includes a conveyance unit that has a rotator in a vacuum container, and circulating carries a workpiece by the rotator along a circular conveyance path, a cylindrical member extended in a direction toward the conveyance path in the vacuum container, a window member that divides a gas space where a process gas is introduced and an exterior, and an antenna causing the process gas to generate inductive coupling plasma for plasma processing when power is applied. The cylindrical member is provided with an opposing part with the opening and faces the rotator, a dividing wall is provided between the opposing part and the rotator so as not to contact the opposing part and the rotator and not to move relative to the vacuum container, and the dividing wall is provided with an adjustment opening that faces the opening, and adjusts a range of the plasma processing.

14 Claims, 16 Drawing Sheets

(51) Int. Cl.
*C23C 14/50* (2006.01)
*C23C 14/56* (2006.01)

(52) U.S. Cl.
CPC ...... *H01J 37/321* (2013.01); *H01J 37/32715* (2013.01); *H01J 37/32761* (2013.01); *H01J 37/32779* (2013.01); *H01J 37/34* (2013.01)

(58) Field of Classification Search
CPC ... C23C 16/4554; C23C 16/509; C23C 14/04; C23C 14/042
See application file for complete search history.

(56) References Cited

U.S. PATENT DOCUMENTS

2007/0240637 A1* 10/2007 Song .................... C23C 14/564 118/50
2018/0286644 A1* 10/2018 Kawamata ........ H01L 21/68764

* cited by examiner

PLASMA PROCESSING APPARATUS

CROSS-REFERENCE TO RELATED APPLICATION

This application is based upon and claims the benefit of priority from Japan Patent Application No. 2017-073050, filed on Mar. 31, 2017, the entire contents of which are incorporated herein by reference.

FIELD OF THE INVENTION

The present disclosure relates to a plasma processing apparatus.

BACKGROUND

In manufacturing processes of various products, such as a semiconductor element, a liquid crystal display, and an optical disk, a thin film like an optical film may be formed on a workpiece, such as a wafer or a glass substrate. This thin film is formed by, for example, film formation process of forming a metal film, etc., on the workpiece, and film processing like etching, oxidization or nitridation to the formed film.

Film formation and film processing can be performed in various schemes, and an example scheme of them is the scheme which applies plasma. In the film formation, an inactive gas is introduced into a chamber in which a target is placed, and a DC voltage is applied to the target to obtain the plasma inactive gas. The ions of the plasma inactive gas are caused to be collided with the target, and material beaten out from the target are deposited on a workpiece to form a film. In the film processing, a process gas is introduced in a chamber in which an electrode is placed, and a high-frequency voltage is applied to the electrode to obtain the plasma process gas. Active species, such as ions and radicals of the plasma process gas, are caused to be collided with the film on the workpiece, thereby performing the film processing.

In order to enable a sequential execution of such film formation and film processing, JP 4428873 B discloses a plasma processing apparatus which has a rotation table that is a rotator installed in a chamber, and which also has multiple film formation units and film processing units installed in the circumferential direction above the rotation table. A workpiece is held on the rotation table and carried in the manner so as to pass through the spaces right below the film formation unit and the film processing unit, and thus an optical film, etc., is formed.

Some plasma processing apparatuses with the rotation table utilize, as a film processing unit, a cylindrical electrode which has a closed upper end and has an opened lower end. When the cylindrical electrode is applied, an opening is provided in the upper part of the chamber, and the upper end of the cylindrical electrode is attached to this opening via an insulation member. A side wall of the cylindrical electrode is extended inside the chamber, and the opened lower end of the cylindrical electrode faces the rotation table via a slight gap. The chamber is grounded, and the cylindrical electrode serves as an anode, while the chamber and the rotation table serve as a cathode. The process gas is introduced in the cylindrical electrode, and the high-frequency voltage is applied to generate plasma. Electrons contained in the generated plasma flow into the cathode that is the rotation table. By causing to pass the workpiece held by the rotation table through the space right below the opened lower end of the cylindrical electrode, active species, such as ions and radicals produced by the plasma are collided with the workpiece, and thus film processing is executed.

Since workpieces to be processed are increasing the size in recent years, and the improvement of the process efficiency is also required, there is a tendency such that the region where plasma is generated to perform film formation and film processing is increasing. When, however, a voltage is applied to the cylindrical electrode to generate plasma, it is sometimes difficult to generate high-density plasma in a wide range.

Accordingly, JP 3586198 B discloses a plasma processing apparatus that generates relatively high-density plasma in a wide range, thus capable of performing a film processing on a large-size workpiece. According to such a plasma processing apparatus, an antenna is installed outside the chamber via a window member like a dielectric between the antenna and a gas space where the process gas is introduced. By applying a high frequency voltage to the antenna, plasma is generated in the gas space by inductive coupling, and thus the film processing is performed.

In this case, an example case in which the plasma processing apparatus utilizes the rotation table, and an apparatus that performs film processing by inductive coupling is applied instead of the cylindrical electrode will be considered. In this case, a cylindrical component (hereinafter, "cylindrical member") to be described later is inserted in the opening of the upper part of the chamber. Accordingly, the gas space where the process gas is introduced from the interior of the cylindrical member toward the lower part thereof is formed. In addition, the window member that is a dielectric is mounted on the flange formed around the opening of the cylindrical member via a sealing member like an O-ring, and thus the gas space is sealed. The dielectric applied for the window member is a material that is relatively hard and brittle like quartz. Still further, between the cylindrical member and the rotation table, a gap is formed so as to ensure a clearance relative to the workpiece and prevent the process gas from leaking and going around.

According to such a structure, when the cylindrical member is heated by the plasma generated in the gas space, the cylindrical member is deformed by heat, and stress is applied to the flange that supports the window member. In this case, the deformation of the flange may cause the window member to be deformed or damaged.

In addition, in order to prevent the process gas from leaking and going around, it is necessary to secure a gap in several millimeters between the surface of the cylindrical member facing the rotation table and the workpiece, but when the deformation by heat as described above occurs, it becomes sometimes difficult to ensure the gap. Still further, when, for example, a part of the chamber is a mechanism that opens and closes a lid, and the cylindrical member is attached at the lid side, the position of the cylindrical member is changed by the position of the opened or closed lid. Hence, it is difficult to precisely adjust the gap between the surface of the cylindrical member facing the rotation table and the rotation table because of the opening and closing of the lid.

An objective of the present disclosure is to provide a plasma processing apparatus that prevents a window member which divides a gas space formed in a cylindrical member and an exterior from being affected by thermal deformation, and is capable of precisely adjusting the gap between the cylindrical member and a workpiece.

SUMMARY OF THE INVENTION

In order to accomplish the above objective, a plasma processing apparatus according to the present disclosure includes:

a vacuum container capable of achieving a vacuumed interior;

a conveyance unit that comprises a rotator provided in the vacuum container and rotating with a workpiece being mounted thereon, and circulates and carries the workpiece along a circular conveyance path by rotating the rotator;

a cylindrical member having an opening at one end extended in a direction toward the conveyance path in the vacuum container;

a window member provided at the cylindrical member, and dividing a gas space between the interior of the cylindrical member and the rotator where a process gas is introduced in the vacuum container from an exterior; and an antenna installed near the window member and outside the gas space, and causing the process gas in the gas space to generate inductive coupling plasma for plasma processing on the workpiece passing through the conveyance path when power is applied, in which:

the cylindrical member is provided with an opposing part that is provided with the opening and faces the rotator;

a dividing wall is provided between the opposing part and the rotator so as not to contact the opposing part and the rotator and not to move relative to the vacuum container;

the dividing wall is provided with an adjustment opening that is provided at the location that faces the opening, and adjusts a range of the plasma processing.

A space between the dividing wall and the opposing part may be gas-tightly sealed by a sealing member. A space between the dividing wall and the opposing part may employ a labyrinth structure that is a combination of non-contact concavities and convexities.

A surface of the dividing wall that faces the rotator may be formed in a shape matching a process surface of the workpiece in a non-contact manner. Alternatively, a surface of the dividing wall that faces the rotator may be formed in a curved shape that matches the curved shape of the workpiece.

An external shape of the dividing wall may be greater than an external shape of the cylindrical member.

The plasma processing apparatus may further include a cooling part that cools the opposing part. The plasma processing apparatus may further include a second cooling part that cools the dividing wall.

The vacuum container may employ a separation structure;

the cylindrical member may be provided at a separated part of the vacuum container; and the rotator and the dividing wall may be provided at another separated part of the vacuum container.

According to the present disclosure, a plasma processing apparatus is provided which prevents a window member that divides a gas space formed in a cylindrical member and an exterior from being affected by thermal deformation, and is capable of precisely adjusting the gap between the cylindrical member and a workpiece.

DETAILED DESCRIPTION OF THE EMBODIMENTS

An embodiment (hereafter, referred to as "this embodiment") of the present disclosure will be described below in detail with reference to the accompanying figures.

[Outline]

Figure 1:
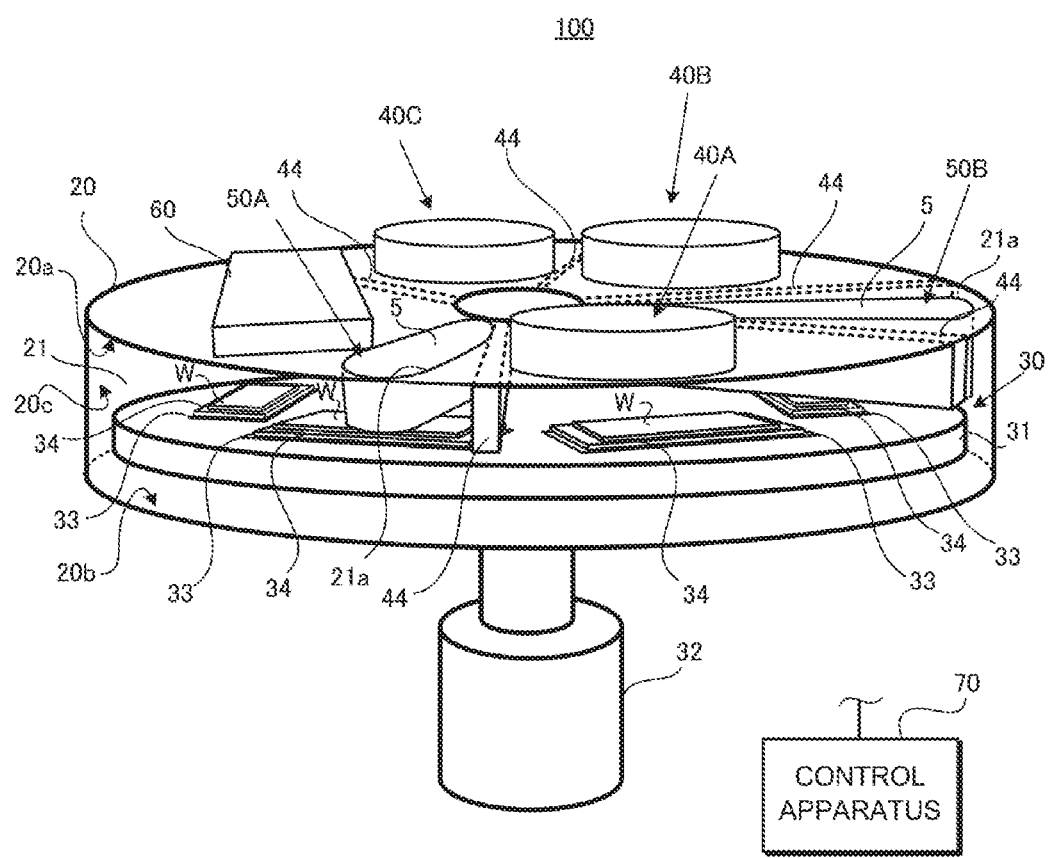
FIG. 1 is a transparent perspective view of a film formation apparatus according to an embodiment of the present disclosure.
Figure 2:
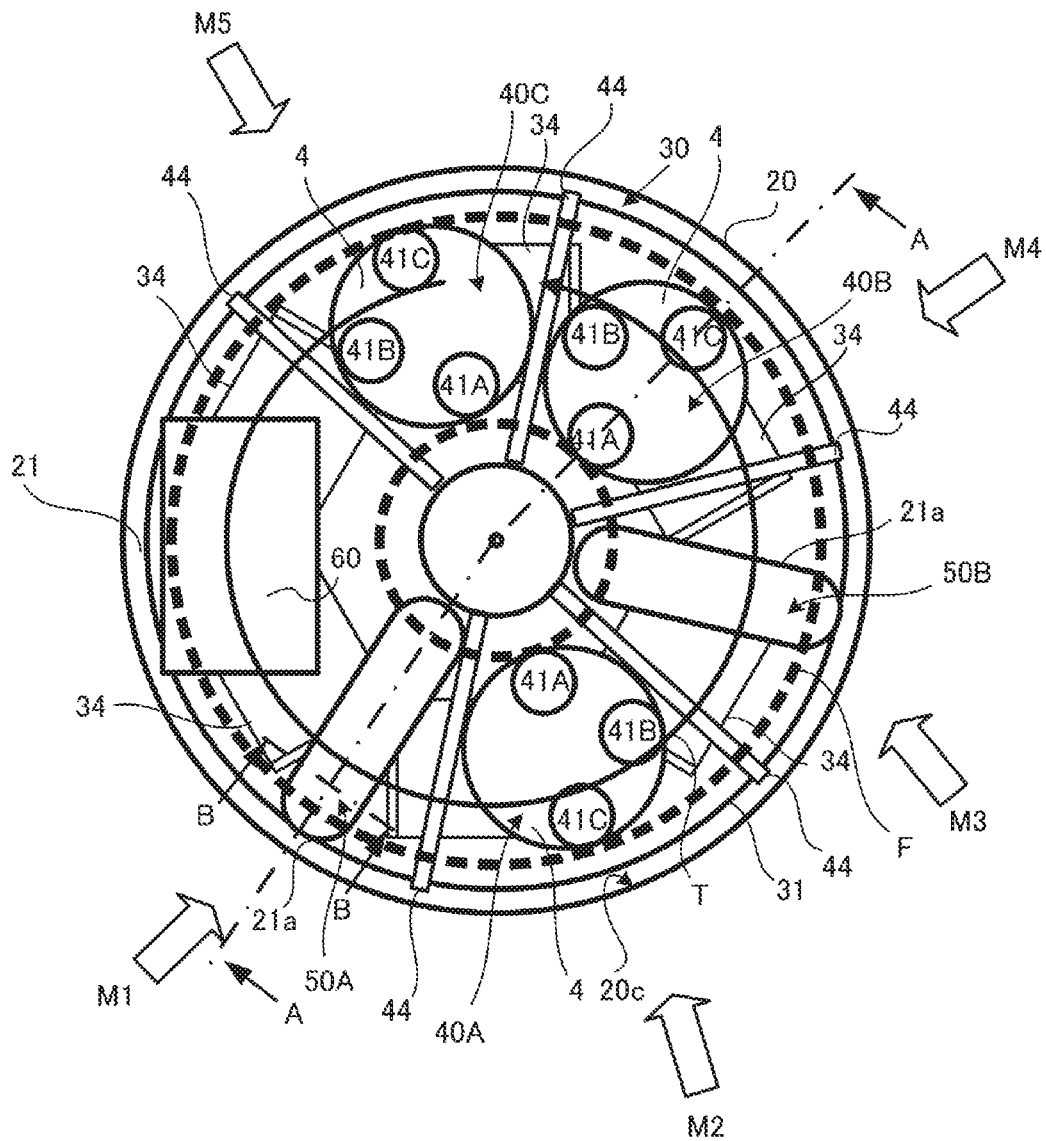
FIG. 2 is a transparent plan view of the film formation apparatus according to the embodiment.
Figure 3:
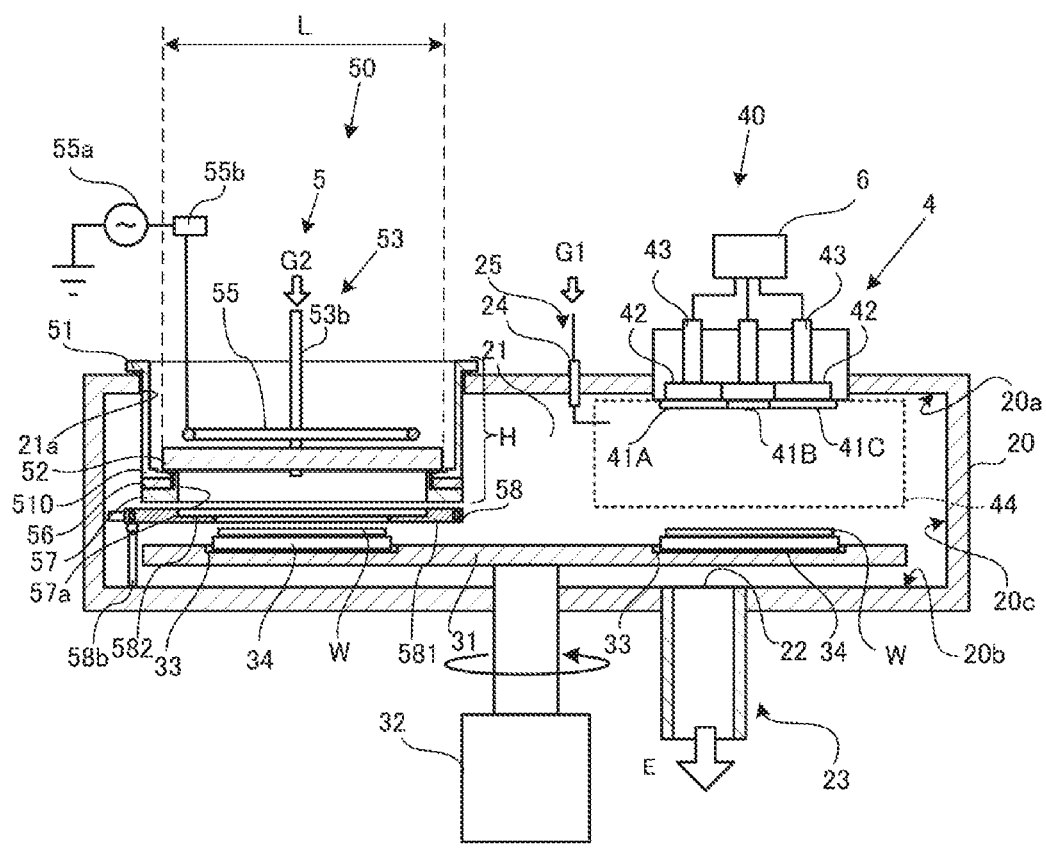
FIG. 3 is a cross-sectional view along a line A-A in FIG. 2.

A plasma processing apparatus 100 illustrated in FIG. 1 forms a chemical compound film, on the surface of each workpiece W, by using plasma. That is, according to this plasma processing apparatus 100, as illustrated in FIGS. 1 to 3, when a rotator 31 rotates, the workpiece W on a tray 34 held by a holding unit 33 moves along a circular trajectory. This movement causes the workpiece W to repeatedly pass through the positions that face film formation units 40A and 40B or 40C. The particles of each target 41A to 41C are stuck to the surface of the workpiece W by sputtering every time the workpiece W passes through the positions. In addition, the workpiece W repeatedly passes through the position facing film processing unit 50A or 50B. The particles sticking to the surface of the workpiece W is combined with the material contained in an introduced process gas G2, and become a compound film every time the workpiece W passes through the position.

[Structure]

As illustrated in FIGS. 1 to 3, such a plasma processing apparatus 100 includes a vacuum container 20, a conveyance unit 30, film formation units 40A, 40B, and 40C, film processing units 50A and 50B, a load lock unit 60, and a control apparatus 70.

[Vacuum Container]

The vacuum container 20 is a container, i.e., a chamber capable of evacuating the interior thereof. The vacuum container 20 has a vacuum chamber 21 formed therein. The vacuum chamber 21 is a sealed space in a cylindrical shape surrounded and defined by a ceiling 20a, an inner bottom 20b, and an inner circumference side 20c of the interior of the vacuum container 20. The vacuum chamber 21 has gas-tightness, and can be vacuumed by depressurization. In addition, the ceiling 20a of the vacuum container 20 is formed so as to be opened and closed. That is, the vacuum container 20 employs a separable structure.

A reactive gas G is introduced to the predetermined region in the interior of the vacuum chamber 21. The reactive gas G contains a sputter gas G1 for film formation, and a process gas G2 for film processing (see FIG. 3). In the following description, when the sputter gas G1 and the process gas G2 are not distinguished, those may be collectively referred to as the reactive gas G. The sputter gas G1 causes the produced ions by plasma generated by application of power to collide with targets 41A to 41C, and causes the materials of the targets 41A to 41C to be deposited on the surface of the workpiece W. For example, inactive gas like argon gas can be applied as the sputter gas G1.

The process gas G2 causes the active species produced by the plasma generated by inductive coupling to penetrate through the film deposited on the surface of the workpiece W, thus forming a chemical compound film. In the following description, a surface process that utilizes plasma but does not utilize the targets 41A to 41C will be referred to as a reverse sputtering. The process gas G2 can be changed as appropriate for the purpose of processing. When, for example, oxidation and nitridation of the film are performed, a mixture gas of oxygen $O_2$ and nitrogen $N_2$ is applied.

As illustrated in FIG. 3, the vacuum container 20 has a discharge port 22 and an inlet port 24. The discharge port 22 is an outlet for ensuring a flow of gas between the exterior and the vacuum chamber 21, and for performing exhaust E. This discharge port 22 is, for example, formed in the bottom portion of the vacuum container 20. A discharge unit 23 is connected to the discharge port 22. The discharge unit 23 includes unillustrated pump, valve, etc. The discharging process by the discharge unit 23 depressurizes the interior of the vacuum chamber 21.

The inlet port 24 is an opening which introduces the sputter gas G1 to each of the film formation units 40A, 40B, and 40C. This inlet port 24 is, for example, provided in the upper part of the vacuum container 20. A gas supply unit 25 is connected to this inlet port 24. The gas supply unit 25 includes, in addition to piping, unillustrated gas supply source of the reactive gas G, pump, valve, etc. The sputter gas G1 is introduced in the vacuum chamber 21 from the inlet port 24 by this gas supply unit 25. In addition, an opening 21a in which the film processing units 50A and 50B to be described later are inserted is formed in the upper part of the vacuum container 20.

[Conveyance Unit]

The outline of the conveyance unit 30 will be described. The conveyance unit 30 includes the rotator 31 that is provided in the vacuum container 20, and on which the workpiece W is mounted. The conveyance unit 30 rotates the rotator 31, thereby circulating and carrying the workpiece W along a circumference of a conveyance path T. The circulation and carriage mean to repeatedly move the workpiece W along the circular trajectory. The conveyance path T is a trajectory on which the workpiece W or the tray 34 to be described later is moved by the conveyance unit 30, and is a circular ring with a width. Hereinafter, the details of the conveyance unit 30 will be described.

The rotator 31 is a flat circular rotation table. The rotator 31 may be formed by, for example, thermally spraying aluminum oxide on the surface of the tabular member formed of stainless steel. In the following description, when simply referred to as "circumferential direction", it means "the circumferential direction of the rotator 31", and when simply referred to as a "radial direction", it means "the radial direction of the rotator 31". In addition, in this embodiment, although a flat plate substrate is utilized as an example of the workpiece W, the type, the shape, and the material of the workpiece W subjected to plasma processing are not limited to any particular ones. For example, a curved substrate which has a recess or a protrusion at the center may be adopted. Still further, the workpiece W that contains conductive materials, such as metal and carbon, insulative materials, such as glass and rubber, and semiconductors like silicon may be adopted. Still further, the number of workpieces W subjected to plasma processing is not limited to any particular number.

In addition to the rotator 31, the conveyance unit 30 has a motor 32 and a holding unit 33. The motor 32 gives drive force to the rotator 31 to rotate around the center of the circle. The holding unit 33 is a component that holds the tray 34 carried by the conveyance unit 30. The multiple holding units 33 are installed on the surface of the rotator 31 at an equal pitch along a circumference. The surface of the rotator 31 as described in this embodiment is the surface facing upwardly, i.e., the upper surface when the rotator 31 is horizontal. For example, the region where each holding unit 33 holds the tray 34 is formed in a direction parallel to the tangent line of the circle in the circumferential direction of the rotator 31, and is provided at an equal pitch in the circumferential direction. More specifically, the holding unit 33 is a groove, a hole, protrusion, a jig, a holder, etc., that holds the tray 34, and can be formed by a mechanical chuck, a sticking chuck, etc.

The tray 34 has, on a side of a rectangular flat plate, a flat mount surface on which the workpiece W is mounted. It is desirable that the material of the tray 34 should have a high thermal conductivity, e.g., metal. In this embodiment, the material of the tray 34 is SUS. The material of the tray 34 may be ceramics and resin with a high thermally conductivity, or a combination thereof. The workpiece W may be directly mounted on the mount surface of the tray 34, or may be indirectly mounted thereon via a frame, etc., that has a sticking sheet. The single workpiece W may be mounted on each tray 34, or the multiple workpieces W may be mounted.

In this embodiment, since the six holding units 33 are provided, the six trays 34 are held on the rotator 31 at the pitch of 60 degrees. However, the number of the holding units 33 may be one or a multiple number. The rotator 31 circulates and carries the trays 34 on which the workpieces W are mounted, and causes the trays 34 to repeatedly pass through the positions facing the film formation units 40A, 40B, and 40C and the film processing units 50A and 50B.

[Film Formation Unit]

The film formation units 40A, 40B, and 40C are provided at positions that face the workpiece W that is circulated and carried along the conveyance path T, and deposit the film formation material on the workpiece W by sputtering to forma film. In the following description, when the multiple film formation units 40A, 40B, and 40C are not distinguished, those will be collectively referred to as the film formation unit 40. As illustrated in FIG. 3, the film formation unit 40 has a sputter source 4, a dividing unit 44, and a power supply 6.

(Sputter Source)

The sputter source 4 is a supply source of the film formation material which deposits the film formation material on the workpiece W by sputtering to form a film. As illustrated in FIGS. 2 and 3, the sputter source 4 includes the targets 41A, 41B, and 41C, backing plates 42, and electrodes 43. The targets 41A, 41B, and 41C are each formed of the film formation material to be deposited on the workpiece W and to be a film, and are installed at positions on the conveyance path T and facing with each other with a clearance.

In this embodiment, the three targets 41A, 41B, and 41C are provided at the positions aligned on the vertices of a triangle as in a planar view. The targets 41A, 41B, and 41C are arranged in sequence in this order from the side close to the rotation center of the rotator 31 toward the outer circumference. In the following description, when the targets 41A, 41B, and 41C are not distinguished, those will be collectively referred to as the target 41. The surface of the target 41 faces, with a clearance, the workpiece W moved by the conveyance unit 30. In addition, the region where the film formation material are deposited by three targets 41A, 41B, and 41C is larger than the dimension of the tray 34 in the radial direction. Thus, a circular region that corresponds to the region where the film formation is performed by the film formation unit 40, and is along the conveyance path T will be referred to as a film formation region F (indicated with a dashed line in FIG. 2). The width of the film formation region F in the radial direction is longer than the width of the tray 34 in the radial direction. In addition, in this embodiment, the three targets 41A to 41C are arranged so as to deposit film formation material across the entire width of the film formation region F in the radial direction without a void.

As for the film formation material, silicon, niobium, etc., are applied. However, various materials are applicable as long as a film can be formed by sputtering. In addition, the target 41 is, for example, in a cylindrical shape. However, other shapes, such as a rectangular cylindrical shape and a columnar cylindrical shape, are adoptive.

The backing plate 42 holds each target 41A, 41B, and 41C individually. The electrode 43 is a conductive member for applying power to each target 41A, 41B, and 41C from the exterior of the vacuum container 20. The power to be applied to each target 41A, 41B, and 41C can be individually changed. Note that the sputter source 4 is provided with a permanent magnet, a cooling mechanism, etc., as appropriate.

(Dividing Unit)

The dividing unit 44 divides film formation positions M2, M4, and M5 where the film formation is performed on the workpiece W by the sputter source 4, and film processing positions M1 and M3 where film processing is performed. As illustrated in FIG. 2, the dividing unit 44 is a rectangular wall plate radially installed from the rotation center of the rotator 31 of the conveyance unit 30. The dividing units 44 are, for example, provided between, on the ceiling 20a of the vacuum chamber 21, the film processing unit 50A, the film formation unit 40A, the film processing unit 50B, the film formation unit 40B, and the film formation unit 40C. The lower end of the dividing unit 44 faces the rotator 31 with a clearance through which the workpiece W passes. The presence of the dividing unit 44 suppresses the reactive gases G of the film formation positions M2, M4 and M5 and the film formation materials thereof from dispersing in the vacuum chamber 21.

The ranges of the film formation positions M2, M4, and M5 in the horizontal direction are divided by the pair of dividing units 44. The film formation materials are deposited on the surface of the workpiece W as a film when the workpiece W circulated and carried by the rotator 31 repeatedly passes through the positions facing the respective targets 41 of the film formation positions M2, M4, and M5. Although the most part of the film formation is performed in these film formation positions M2, M4, and M5, there is a leakage of the film formation material in the region other than such regions, thus there is a little film formation material deposition. That is, the region where the film formation is performed is slightly wider than each film formation position M2, M4, and M5.

(Power Supply)

The power supply 6 applies the power to the target 41. Application of the power to the target 41 by this power supply 6 generates the plasma sputter gas G1. The film formation material beaten out from the target 41 is deposited on the workpiece W by causing the ions produced by plasma to collide with the target 41. The power applied to each target 41A, 41B, and 41C can be individually changed. In this embodiment, the power supply 6 is, for example, a DC power supply that applies a high voltage. In the case of an apparatus that performs high frequency sputtering, an RF power supply may be adopted. The rotator 31 has the same potential as that of the grounded vacuum container 20, and a potential difference is produced by applying a high voltage to the target 41.

Such film formation unit 40 can increase the film formation amount within a certain time period, i.e., a film formation rate by simultaneously forming a film by using the same film formation material to the multiple film formation units 40A, 40B, and 40C. In addition, a film formed of the layers of the multiple film formation materials can also be formed by performing film formation simultaneously or in sequence by using the film formation units 40A, 40B, and 40C to which the different types of film formation materials are applied.

In this embodiment, as illustrated in FIGS. 1 and 2, the three film formation units 40A, 40B, and 40C are installed between the film processing units 50A and 50B in the carrying direction of the conveyance path T. The film formation positions M2, M4, and M5 correspond to the three film formation units 40A, 40B, and 40C, respectively. The film processing positions M1 and M3 correspond to the two film processing units 50A and 50B, respectively.

[Film Processing Unit]

The film processing units 50A and 50B perform film processing on the material deposited on the workpiece W carried by the conveyance unit 30. In the following description, this film processing is a reverse sputtering that does not utilize the target 41. In the following description, when the film processing units 50A and 50B are not distinguished, those will be collectively referred to as the film processing unit 50. The film processing unit 50 has a processing unit 5. An example structure of this processing unit 5 will be described with reference to FIGS. 3 to 6.

Figure 4:
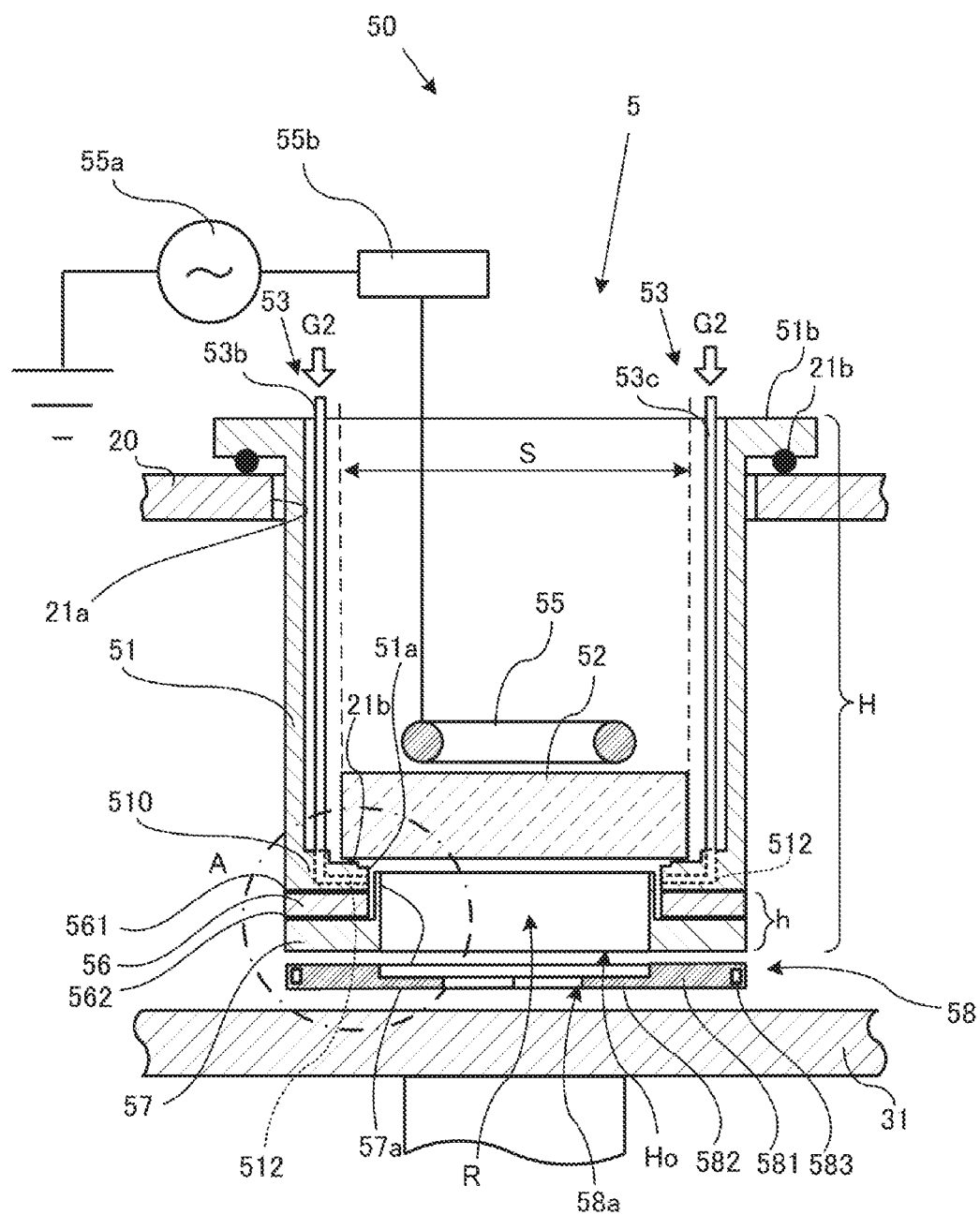
FIG. 4 is a cross-sectional view along a line B-B in FIG. 2.

As illustrated in FIGS. 3 and 4, the processing unit 5 has a cylindrical member H, a window member 52, a supply unit 53, an adjusting unit 54 (see FIG. 9), an antenna 55, and a dividing wall 58. The cylindrical member H is extended in the direction in which an opening Ho at an end is directed toward the conveyance path T inside the vacuum container 20. The cylindrical member H has a cylindrical body 51 and an opposing part h. The opposing part h has the opening Ho, and is extended toward the rotator 31. Among the members that form the cylindrical member H, first, the cylindrical body 51 will be described, and the opposing part h will be described later.

The cylindrical body 51 has a horizontal cross-section that is in a rectangular shape with rounded corners. The term rectangular shape with rounded corners is a shape of the track for athletic sports. The track shape is a shape that has a pair of partial circles facing with each other with a distance therebetween and with an outward protruding direction, and respective both ends are connected by parallel straight lines. The cylindrical body 51 is formed of the same material as that of the rotator 31. The cylindrical body 51 is inserted in the opening 21a provided in the ceiling 20a of the vacuum container 20 in such a way that the opening Ho is directed toward the rotator 31 side with a distance. Hence, the most part of the side walls of the cylindrical body 51 are held in the vacuum chamber 21. The cylindrical body 51 is installed in such a way that the longer radius direction is in parallel with the radial direction of the rotator 31. A strict parallel is unnecessary, and a slight slant is allowable.

As illustrated in FIG. 4, the window member 52 is provided on the cylindrical member H, and divides a gas space R in the vacuum container 20 where a process gas G2 is introduced, from the exterior thereof. In this embodiment, the window member 52 is provided on the cylindrical body 51 that forms the cylindrical member H. In the film processing unit 50, the gas space R is formed between the rotator 31 and the interior of the cylindrical member H, and the workpiece W circulated and carried by the rotator 31 repeatedly passes through the gas space R. The window member 52 is fitted in the interior of the cylindrical body 51, and is a dielectric plate like quartz having an approximately similar shape as the horizontal cross-section of the cylindrical body 51 (see FIG. 8). The window member 52 is a plate in a rectangular shape with rounded corners that is an approximately similar shape to the horizontal cross-section of the cylindrical body 51 installed as described above. That is, as illustrated in FIGS. 3 and 4, the window member 52 has a longer length L of the direction intersecting the conveyance path T than a length S along the conveyance path T (see FIG. 8). Note that the window member 52 may be dielectrics like alumina, or may be a semiconductor like silicon.

Figure 5:
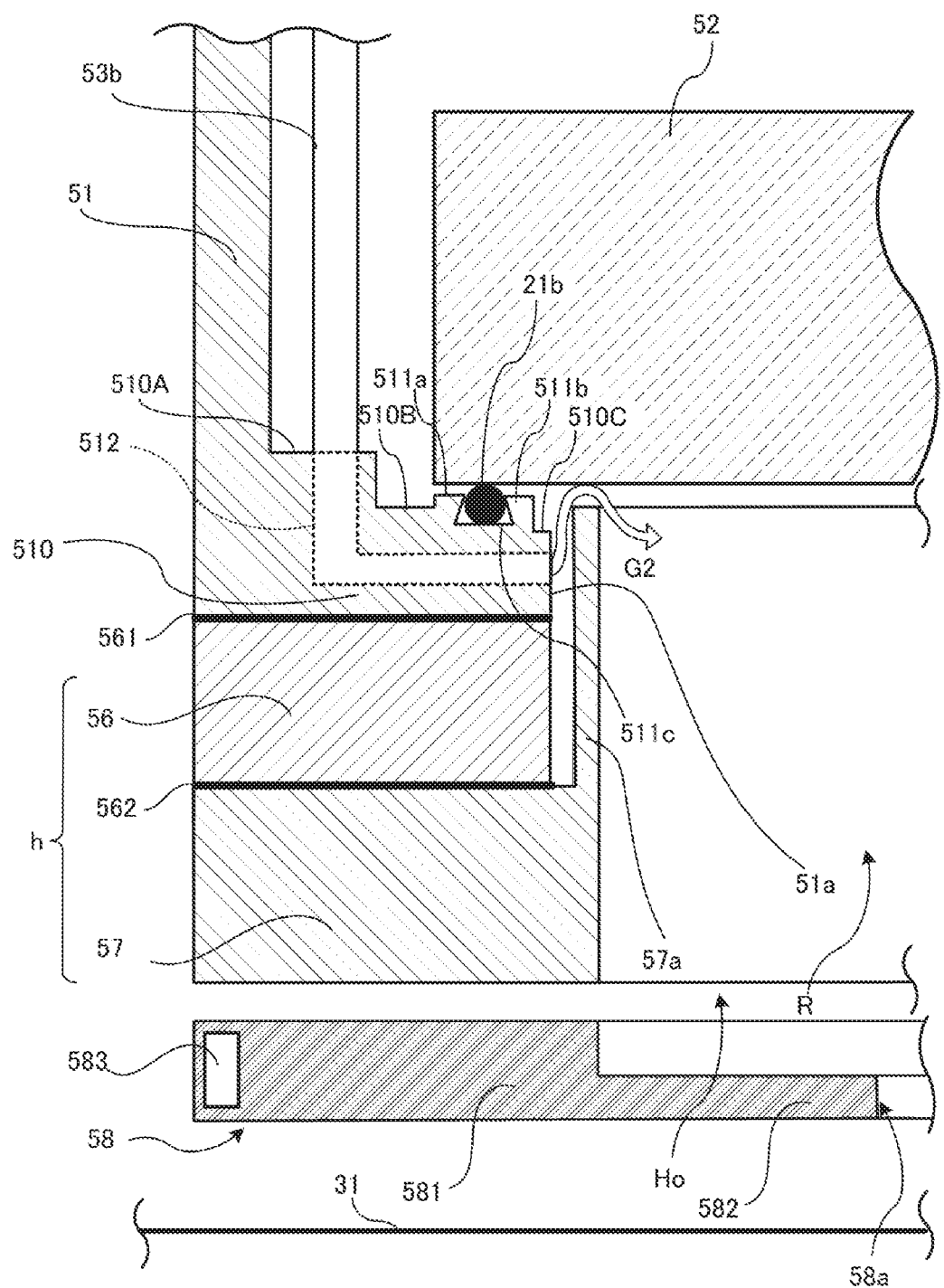
FIG. 5 is an enlarged view illustrating the details of the part A in FIG. 4.

As illustrated in FIG. 5, the cylindrical member H is provided with a support 510 that supports the window member 52. In this embodiment, the support 510 is provided on the cylindrical body 51 that forms the cylindrical member H. Provided between the support 510 and the window member 52 is a sealing member 21b that gas-tightly seals the gas space R from the exterior.

The structures of the support 510, the window member 52, and the sealing member 21b will be respectively described below in more detail. As illustrated in FIGS. 4 and 5, the support 510 is a thickened part that protrudes inwardly relative to the cylindrical body 51 in such a way that the inner edge at one end of the cylindrical body 51 protrudes across the entire circumference so as to be in an L-shape as viewed in a vertical cross-section orthogonal to the outer circumference. The innermost circumference of this support 510 is an opening 51a in a rectangular shape with rounded corners that is approximately similar to the cross-section of the cylindrical body 51.

The support 510 has a shape like a stair by having seats 510A, 510B, and 510C which become lower from the inner wall of the cylindrical body 51 toward the opening 51a.

The seat 510B has a first opposing surface 511a, a second opposing surface 511b, and a groove 511c (dovetail groove). The first opposing surface 511a is a flat top surface where a part of the seat 510B protrudes toward the window member 52 across the entire circumference. The first opposing surface 511a is a surface that is provided on the seat 510B at the external side of the gas space R, and faces the window member 52. The second opposing surface 511b is a surface that is provided at the gas-space-R side in the seat 510B, and faces the window member 52. The second opposing surface 511b is a flat top surface that is a part protruding toward the window member 52 across the entire internal circumference relative to the first opposing surface 511a. The groove 511c is a recess (dovetail groove) formed across the entire circumference between the first opposing surface 511a and the second opposing surface 511b, and a sealing member 21b in an endless shape is fitted therein. The sealing member 21b is, for example, an O-ring. The upper part of this sealing member 21b protrudes from the groove 511c, and the opening 51a is gas-tightly sealed when the window member 52 is mounted thereon.

As illustrated in FIGS. 4 and 5, a supply port 512 is formed in the support 510. The supply port 512 is to supply the process gas G2 in the cylindrical body 51 as illustrated in FIGS. 4 and 5. As illustrated in FIG. 5, the supply port 512 penetrates from the seat 510A to the opening 51a so as to be in an L-shape. The supply ports 512 are provided, in the support 510, at the downstream side of the conveyance path T and at the upstream side thereof. Each supply port 512 is provided at the location facing with each other.

In addition, as illustrated in FIG. 4, an outer flange 51b is formed at the opposite end to the opening 51a in the cylindrical body 51. Provided between the bottom of the outer flange 51b and the ceiling of the vacuum container 20 is a sealing member 21b across the entire circumference, and thus the opening 21a is gas-tightly sealed.

Figure 6:
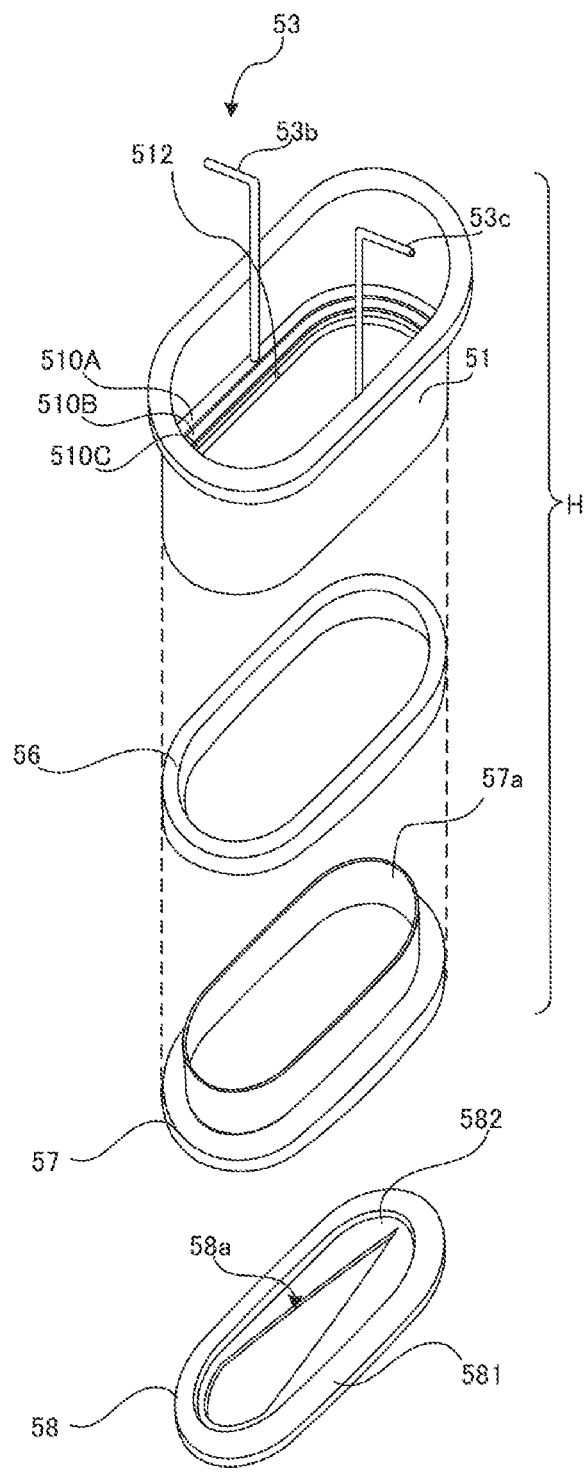
FIG. 6 is an exploded perspective view illustrating a processing unit according to the embodiment.
Figure 9:
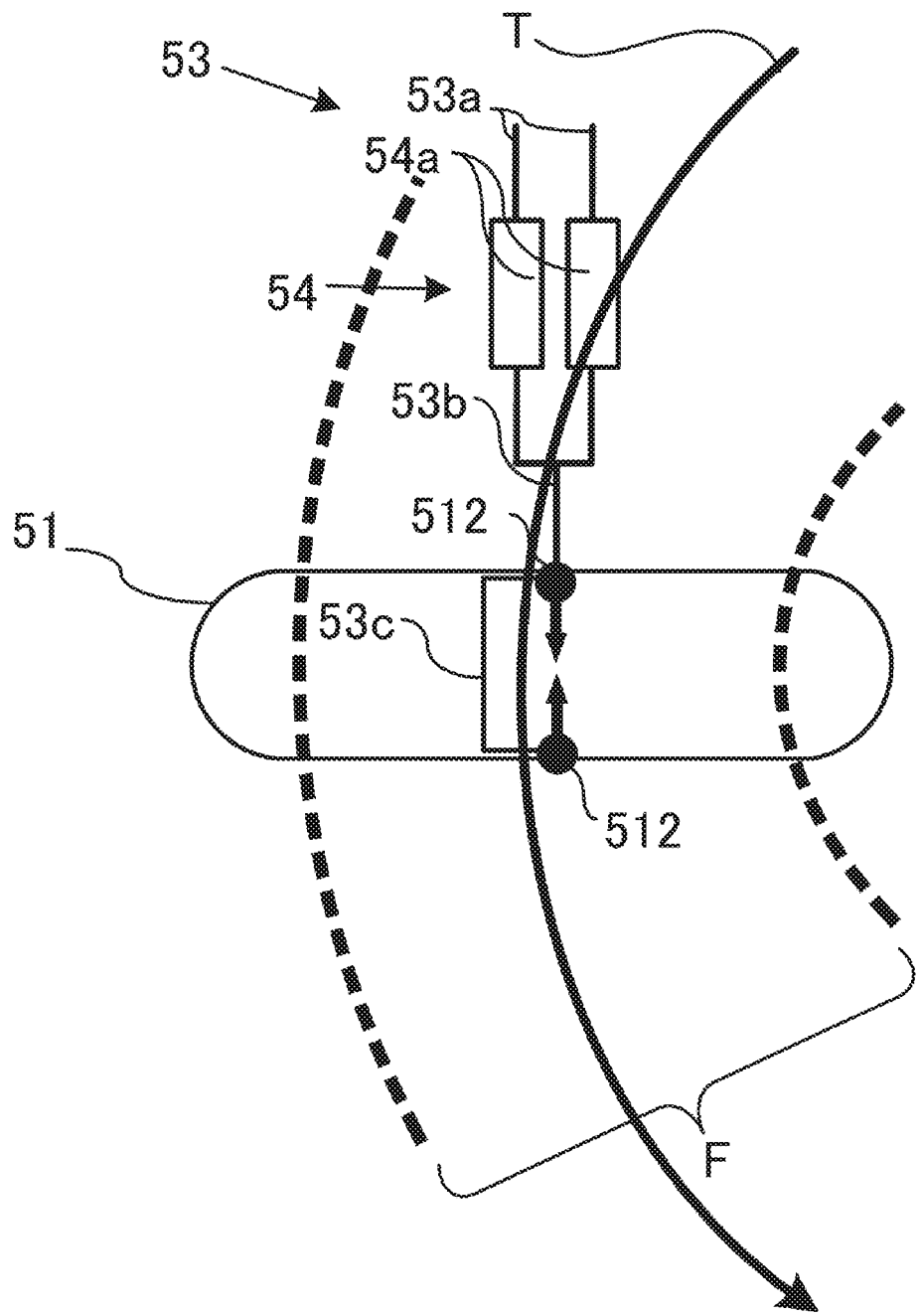
FIG. 9 is an exemplary diagram illustrating a flow channel of the process gas.

As illustrated in FIGS. 4, 6 and 9, the supply unit 53 supplies the process gas G2 in the gas space R. The supply unit 53 includes an unillustrated supply source of the process gas G2, and pipes 53a, 53b, and 53c connected thereto. The process gas G2 is, for example, oxygen and nitrogen. The pipe 53a is a pair of paths from the respective supply sources of the process gas G2. The pipe 53b is a path where the pair portions of the pipe 53a are merged. The pipe 53b is connected to the one supply port 512. The pipe 53c is branched from the pipe 53b, and is connected to the other supply port 512 (see FIG. 9).

The adjusting unit 54 adjusts the supply amount of the process gas G2 introduced from the supply port 512 as illustrated in FIG. 9. That is, the adjusting unit 54 adjusts the supply amount of the individual process gas G2 per a unit time by the supply unit 53. The adjusting unit 54 has a mass-flow controller (MFC) 54a located at each pipe 53a. The MFC 54a includes a mass-flow meter that measures the flow volume of a fluid, and an electromagnetic valve that controls the flow volume.

Figure 8:
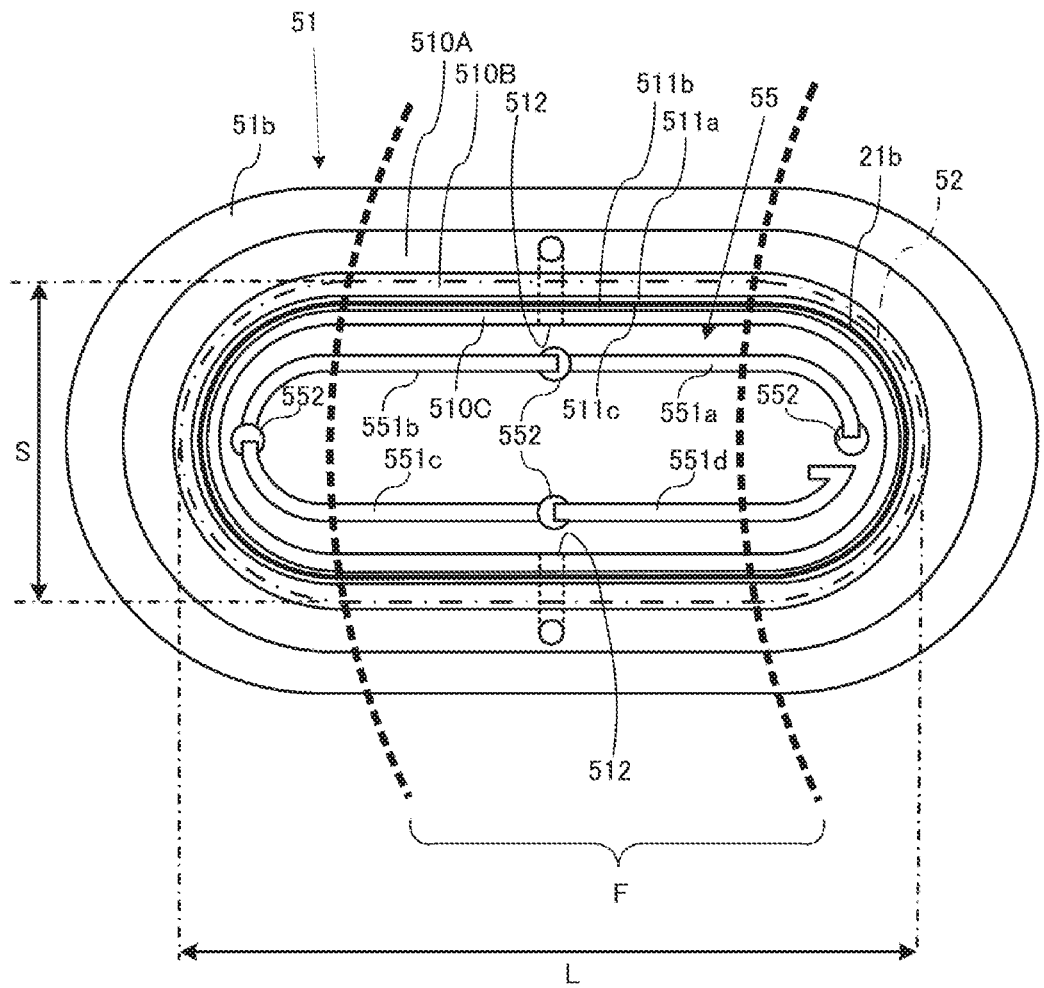
FIG. 8 is a transparent plan view illustrating the processing unit according to the embodiment.
Figure 10:
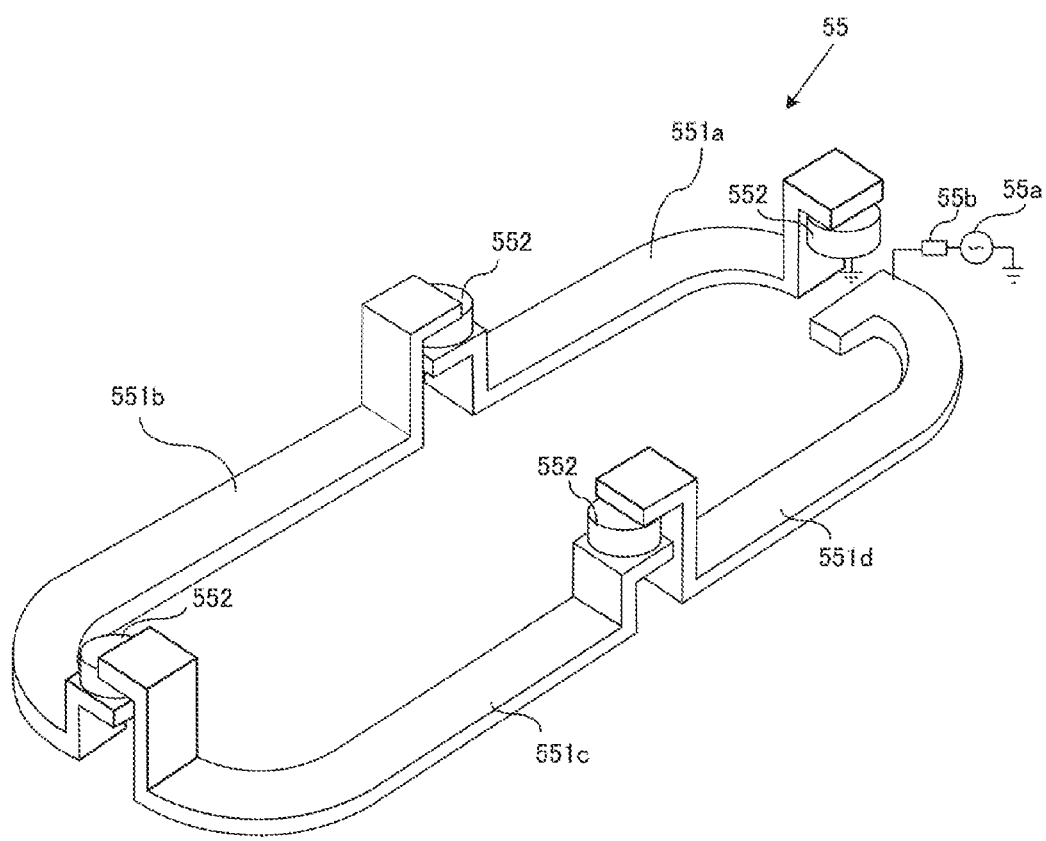
FIG. 10 is a perspective view illustrating an antenna according to the embodiment.

The antenna 55 generates the inductive coupling plasma to process the workpiece W that passes through the conveyance path T as illustrated in FIGS. 8 and 10. The antenna 55 is installed outside the gas space R and near the window member 52. Application of power to the antenna 55 produces the electric field induced by the magnetic field produced by an antenna current, causing the process gas G2 in the gas space R to be turned into plasma. The distribution shape of the inductive coupling plasma to be generated can be changed by the shape of the antenna 55. In this embodiment, the inductive coupling plasma in an approximately similar distribution shape to the horizontal cross-section of the gas space R in the cylindrical body 51 can be generated by employing the antenna 55 in the shape as described below.

The antenna 55 includes multiple conductors 551a to 551d and capacitors 552. The multiple conductors 551 are each a band-shape conductive member, and form an electrical path in a rectangular shape with rounded corners in a planar view when connected to each other via the capacitors 552. The external shape of this antenna 55 is equal to or smaller than the opening 51a.

Each capacitor 552 is in a substantially cylindrical shape, and is connected in series between the conductors 551a, 551b, 551c, and 551d. When the antenna 55 is formed of conductors only, voltage amplitude becomes excessive at the end near the power supply, and the window member 52 is eliminated locally. Accordingly, by dividing a conductor and connecting the capacitor 552, a small voltage amplitude occurs at the end of each conductor 551a, 551b, 551c, and 551d, suppressing the local elimination of the window member 52.

However, in the capacitor 552 part, the continuity of the conductors 551a, 551b, 551c and 551d is discontinued, decreasing the plasma density. For this reason, the respective ends of the conductors 551a, 551b, 551c, and 551d facing with the window member 52 are overlapped with each other in the planar direction, thus holding the capacitor 552 from the upper side and from the lower side. More specifically, as illustrated in FIG. 10, connection ends of the conductors 551a, 551b, 551c and 551d to the capacitor 552 is bent so as to have a reverse L-shape cross-section. Clearances that hold the capacitor 552 from the upper side and from the lower side are formed in the horizontal planes of the respective ends of the adjacent conductors 551a and 551b. Likewise, clearances that hold the capacitor 552 from the upper side and from the lower side are formed in the horizontal planes of the respective ends of the conductors 551b and 551c, and the horizontal planes of the respective ends of the conductors 551c and 551d.

An RF power supply 55a for applying the high frequency power is connected to the antenna 55. A matching box 55b that is a matching circuit is connected in series at the output side of the RF power 55a. For example, one end of the conductor 551d and the RF power supply 55a is connected to each other. In this example, the conductor 551a is aground side. The matching box 55b is connected between the RF power supply 55a and the one end of the conductor 551d. The matching box 55b matches the impedance at the input side with the impedance at the output side, thereby stabilizing the plasma discharge.

The opposing part h includes a cooling part 56 and a dispersing part 57. As illustrated in FIGS. 4, 5, and 6, the cooling part 56 is a cylindrical member in a rectangular shape with rounded corners that substantially matches the outer shape of the cylindrical body 51, and has an upper surface contacting and matching the bottom of the cylindrical body 51. Although it is not illustrated in the figure, cavities through which cooling water flows are formed in the cooling part 56. In the cavity, a supply port and a discharge port, connected to a chiller that is a cooling water circulating apparatus that circulates and supplies the cooling water, are in connected with each other. The cooling water cooled by the chiller is supplied from the supply port, flows through the cavities, and is discharged from the discharge port. By repeating such processes, the cooling part 56 is cooled, thus suppressing the heating of the cylindrical body 51 and the dispersing part 57.

The dispersing part 57 is a cylindrical member in a rectangular shape with rounded corners that matches the external shapes of the cylindrical body 51 and the cooling unit 56, and has an upper surface contacting and matching the bottom of the cooling part 56. The dispersing part 57 is provided with a dispersing plate 57a. The dispersing plate 57a is disposed at the position with a clearance from the supply port 512 and facing the supply port 512, disperses the process gas G2 introduced from the supply port 512, and causes this gas to flow in the gas space R. The dispersing part 57 has a greater width in the horizontal direction at the annular part than the cylindrical body 51 by an amount corresponding to the dispersing plate 57a provided inwardly.

More specifically, the dispersing plate 57a stands upright from the inner edge of the dispersing part 57 across the entire circumference, goes over the cooling part 56, and is extended to the position near the bottom of the window member 52. As illustrated in FIG. 5, the flow channel of the process gas G2 between the dispersing plate 57a and the supply port 512 is closed at the rotator-31 side, and is in connected with the gas space R at the window-member-52 side. That is, an annular gap in connected with the gas space R below the window member 52 is formed between the support 510 and the dispersing plate 57a with the upper side of such a gap extending along the lower surface of the window member 52.

In addition, since the dispersing plate 57a enters the gas space R in the cylindrical body 51, the plasma generating region in the gas space R is the internal space relative to the dispersing plate 57a. In addition, the distance between the dispersing plate 57a and the window member 52 may be 1 to 5 mm, for example. When this distance is equal to or less than 5 mm, an occurrence of abnormal discharge in the gap can be prevented. In addition, in this embodiment, internal edge of the lower end of the dispersing part 57 becomes the opening Ho of the opposing part h, and the opening Ho of the opposing part h is also the opening Ho of the cylindrical member H.

The process gas G2 is introduced in the gas space R via the supply port 512 from the supply unit 53, and high frequency voltage is applied to the antenna 55 from the RF power supply 55a. This produces the electric field in the gas space R via the window member 52, generating the plasma of the process gas G2. Hence, active species, such as electrons, ions, and radicals are produced.

Sheets 561, 562 are installed between the cooling part 56 and the cylindrical body 51, and between cooling part 56 and the dispersing part 57. The sheets 561 and 562 are thin-film member that enhance the close contact among the cooling part 56 and the cylindrical body 51, and the dispersing part 57, thereby enhancing the thermal conductivity. For example, a carbon sheet is applied.

As illustrated in FIGS. 4 to 7, the dividing wall 58 is a member provided between the opposing part h and the rotator 31 so as not to contact the opposing part h and the rotator 31, and not movable relative to the vacuum container 20. The dividing wall 58 has a function of trapping the plasma, and preventing the process gas G2 from dispersing to the film formation unit 40. The dividing wall 58 is provided at the position facing the opening Ho, and is formed with an adjustment opening 58a that adjusts the range of plasma processing.

More specifically, the dividing wall 58 is an annular plate in a rectangular shape with rounded corners that substantially matches the external shape of the cylindrical body 51, and includes a base body 581 and a shielding plate 582. The base body 581 is a thick flat that defines the external shape of the dividing wall 58. The shielding plate 582 is formed at the inner edge of the base body 581, is a thinner plate than the base body 581, and the adjustment opening 58a is formed inwardly in the shielding plate 582. The adjustment opening 58a has different sizes at the outer circumference side of the rotator 31 and at the internal side thereof relative to the outer circumference (hereinafter, referred to as an inner circumference side). The frame of the process region for plasma processing, i.e., the film processing on the workpiece W is defined by the adjustment opening 58a. In this case, when the outer circumference side of the rotator 31 is compared with the inner circumference side thereof, a difference is caused in the speed that passes through a certain distance. That is, like the cylindrical body 51 in this embodiment, when the longer diameter direction is disposed so as to be in parallel with the radial direction of the rotator 31, the time at which the rotator 31 passes through the lower part of the cylindrical body 51 becomes shorter at the outer circumference side than at the inner circumference side. Hence, in this embodiment, in order to set the time at which the workpiece W is exposed to the plasma to be uniform at the inner circumference side and at the outer circumference side to achieve the uniform processing rate, the range where the plasma is shielded is defined by the shielding plate 582 as described above. That is, the shape of the adjustment opening 58a defines the region where the workpiece w is exposed to the plasma. This means that providing the shielding plate 582 at the dividing wall 58 at the position facing the opening Ho so as to adjust the range of the plasma processing has the same significance as providing the adjustment opening 58a that adjusts the range of the plasma processing. Example shapes of the adjustment opening 58a are a sector shape and a triangular shape. In addition, the shielding range can be adjusted by replacing the shielding plate 582 with the shielding plate 582 that has a different center angle of the sector or triangle so as not to be larger than the opening Ho.

The dividing wall 58 may be formed of a conductive material. In addition, a material with a low electrical resistance may be applied. Examples of such a material are aluminum, stainless steel, or copper. The same material as that of the rotator 31 may be applied, or a different material may be applied. The dividing wall 58 may be formed by thermally spraying aluminum oxide on the surface of a plate member formed of stainless steel. The dividing wall 58 is subjected to plasma processing like the workpiece W, is deteriorated by heat, and thus a replacement is necessary. Accordingly, in accordance with the details of the plasma processing, when coating, such as etching prevention agent, anti-oxidization agent, or nitridation prevention agent is provided, the frequency of replacement is decreased. In addition, since the dividing wall 58 is formed separately from the cylindrical member H, the replacement work is easy.

As illustrated in FIG. 3, the dividing wall 58 is fastened by a support member 58b so as to be located in a non-contact manner between the dispersing part 57 of the opposing part h and the rotator 31. The support member 58b supports and fastens the external side of the dividing wall 58 in the radial direction from the exterior of the rotator 31. The support member 58b is a pillar member, and is formed so as to stand upright from an inner bottom 20b and extend up to the location higher than the surface of the rotator 31, thereby supporting the base body 581 that extends outwardly relative to the outer edge of the rotator 31. That is, the cylindrical body H is provided at the one side of the vacuum container 20 that employs the separation structure, i.e., the openable and closable ceiling 20, while the rotator 31 and the dividing wall 58 are provided at the other side, i.e., the inner bottom 20b.

Figure 7:
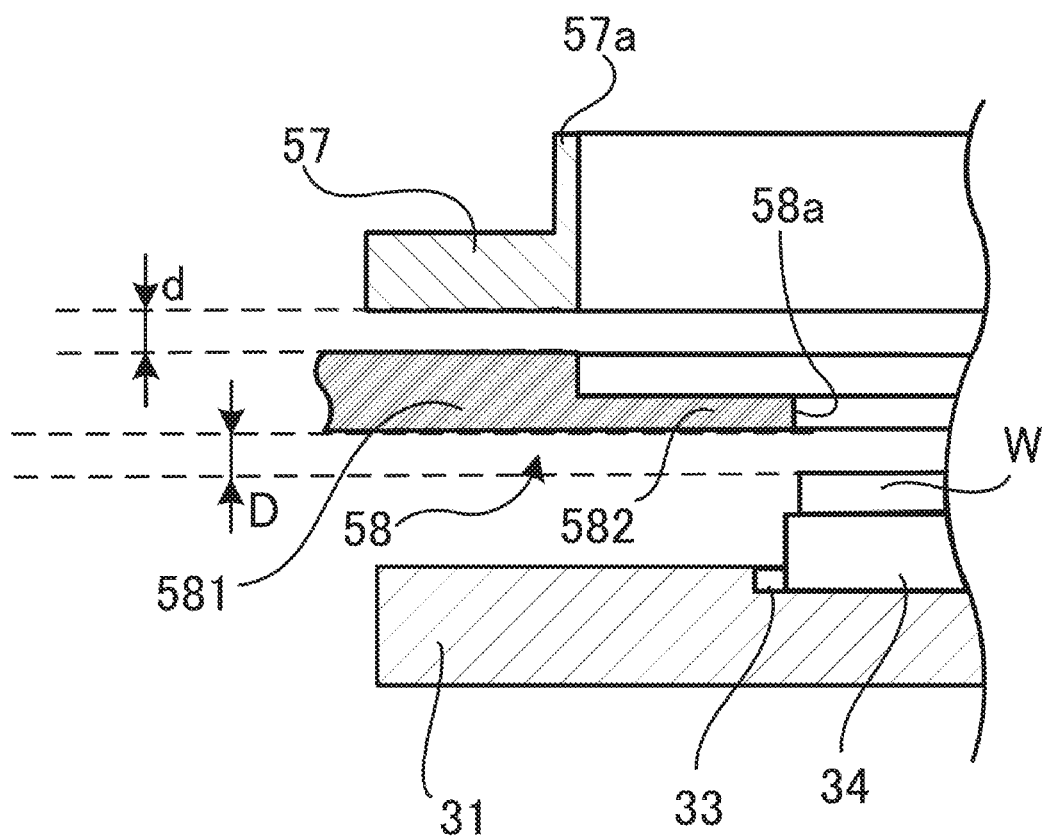
FIG. 7 is an explanatory diagram illustrating a clearance among a dispersing part, a dividing wall, and a workpiece.

As illustrated in FIG. 7, a gap D is secured between the dividing wall 58 and the workpiece W. This is to enable the workpiece W to pass through, and to maintain the internal pressure of the gas space R, and for example, such a gap can be 5 mm to 15 mm. According to this embodiment, however, since the gap d is caused between the dispersing part 57 and the dividing wall 58, in order to maintain the pressure in the gas space R, it is preferable that the gap D should be as small as possible, and should not exceed 15 mm when combined with the gap d. That is, 5 mm≤D+d≤15 mm is preferable. For example, gap D=gap d=5 mm or so is applicable.

Still further, as illustrated in FIGS. 4 and 5, the dividing wall 58 includes a cooling part (the second cooling part) 583. The cooling part 583 is water passage that is provided inside the dividing wall 58, and through which the cooling water flows. In the water passage, a supply port and a discharge port, connected to the chiller which is a cooling water circulating apparatus that circulates and supplies the cooling water, are in connected with each other. The cooling water cooled by this chiller is supplied from the supply port, flows through the water passage, and is discharged from the discharge port. By repeating such processes, the dividing wall 58 is cooled. Although the water passage is formed by, for example, a pipe that gas-tightly passes through the inner bottom 20b along the support member 58b, and extends to the exterior of the vacuum container 20.

[Load Lock Unit]

The load lock unit 60 carries, while maintaining vacuumed condition of the vacuum chamber 21, the tray 34 on which the unprocessed workpiece W is mounted in the vacuum chamber 21 from the exterior by unillustrated conveyance means, and ejects the tray 34 on which the processed workpiece W is mounted to the exterior of the vacuum chamber 21. A conventionally well-known structure is applicable to this load lock unit 60, and thus a detailed description will be omitted.

[Control Apparatus]

The control apparatus 70 controls each unit of the plasma processing apparatus 100. This control apparatus 70 can be realized by, for example, a special-purpose electronic circuit or a computer that operates under a predetermined program. That is, as for the control on introduction and discharge of the sputter gas G1 and the process gas G2 to the vacuum chamber 21, the control on the power supply 6 and the RF power supply 55a, and the control on the rotation of the rotator 31, the control details are programmed beforehand. The control apparatus 70 is executed when the program is run by a processing unit, such as a PLC and a CPU, and is capable of coping with various specifications of plasma processing.

Specific control details are as follow. That is, those are the rotating speed of the motor 32, the initial discharging pressure of the plasma processing apparatus 100, the selection of the sputter source 4, the applied power to the target 41 and the antenna 55, the flow volume, type, introducing time and discharging time of the sputter gas G1 and the process gas G2, the time for film formation, and the time for film processing, etc.

In particular, according to this embodiment, the control apparatus 70 controls the power application to the target 41 of the film formation unit 40, and a supply amount of the sputter gas G1 from the gas supply unit 25, thereby controlling the film formation rate. In addition, the control apparatus 70 controls the power application to the antenna 55, and the supply amount of the process gas G2 from the supply unit 53, thereby controlling the film processing rate.

Figure 11:
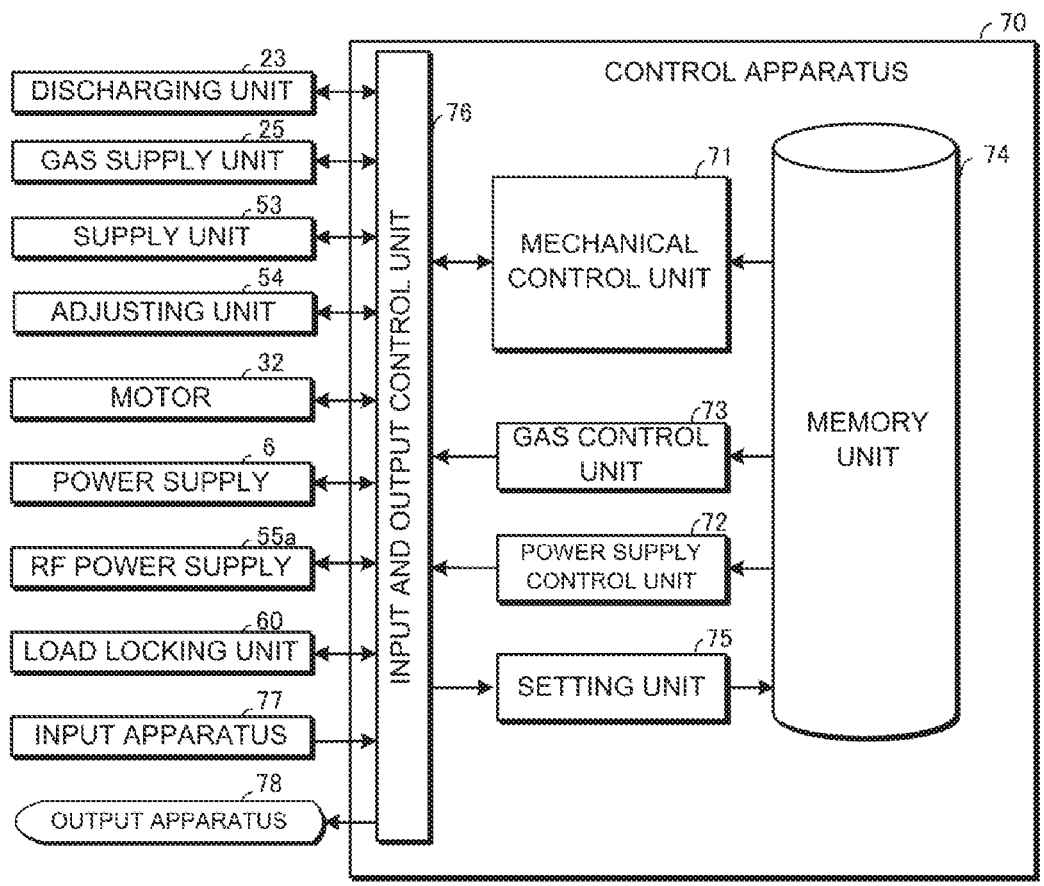
FIG. 11 is a block diagram illustrating a structure of a control apparatus according to the embodiment.

A structure of the control apparatus 70 that causes each unit to execute as describe above will be described with reference to FIG. 11 that is a virtual functional block diagram. That is, the control apparatus 70 includes a mechanism control unit 71, a power supply control unit 72, a gas control unit 73, a memory unit 74, a setting unit 75, and an input and output control unit 76.

The mechanism control unit 71 is a processing unit that controls the drive sources, electro-magnetic valves, switches, power supplies, etc., of the discharge unit 23, the gas supply unit 25, the supply unit 53, the adjusting unit 54, the motor 32, and the load lock unit 60. The power supply control unit 72 controls the power supply 6 and the RF power supply 55a. For example, the power supply control unit 72 controls the individual power applied to the targets 41A, 41B, and 41C. When it is desired to achieve a uniform film formation rate throughout the entire workpiece W, in view of the speed difference at the inner circumference and at the outer circumference as described above, the power is sequentially increased so as to be the target 41A<the target 41B<the target 41C. That is, the power may be set so as to be proportional to the speed at the inner circumference and at the outer circumference. However, the control to be proportional is merely an example, and setting may be made in such a way that the faster speed increments the power so that the uniform processing rate is achieved. In addition, as for the location where a thicker film on the workpiece W is desired, the applied power to the target 41 may be increased, and as for the location where a thinner film is desired, the applied power to the target 41 may be reduced.

The gas control unit 73 is a processing unit that controls the introduced amount of the process gas G2 by the adjusting unit 54. In addition, the gas control unit 73 also controls the introduced amount of the sputter gas G1. The memory unit 74 stores necessary information for the control according to this embodiment. Information stored in the memory unit 74 contains the discharge amount by the discharge unit 23, the power applied to each target 41, the supply mount of the sputter gas G1, the power applied to the antenna 55, and the supply amount of the process gas G2 from the supply port 512. The setting unit 75 is a processing unit that sets externally input information in the memory unit 74. The power applied to the antenna 55 is determined in accordance with, for example, the desired film thickness when the rotator 31 rotates by a turn, and the rotating speed (rpm) of the rotator 31.

The input and output control unit 76 is an interface that controls signal conversion, input and output with each unit subjected to the control. In addition, the control apparatus 70 is connected to an input apparatus 77 and an output apparatus 78. The input apparatus 77 is input means, such as a switch, a touch panel, a keyboard, and a mouse, for an operator to operate the plasma processing apparatus 100 via the control apparatus 70. For example, a selection of the film formation unit 40 and the film processing unit 50 to be applied, a desired film thickness, an applied power to each target 41A to 41C, and a supply amount of the process gas G2 from the supply port 512, etc., can be input via the input means.

The output apparatus 78 is output means, such as a display, a lamp, and a meter, etc., that enable the operator to visually check information to confirm the status of the apparatus. For example, the output apparatus 78 is capable of displaying an information input screen via the input apparatus 77. In this case, a scheme that displays the targets 41A, 41B, and 41C by exemplary diagrams, enables a selection of each position and an input of a numerical value may be employed. In addition, a scheme that displays the targets 41A, 41B, and 41C by exemplary diagrams, and displays a numerical value set for each target may be employed.

[Operation]

An operation according to this embodiment as described above will be described below with reference to FIGS. 1 to 11. Although it is not illustrated in the figures, the tray 34 on which the workpiece W is mounted is carried in, carried through, and carried out relative to the plasma processing apparatus 100 by conveyance means, such as a conveyer and a robot arm.

The multiple trays 34 are sequentially carried in the vacuum container 20 by the conveyance means of the load lock unit 60. The rotator 31 moves the empty holding unit 33 to the carrying-in position from the load lock unit 60 in sequence. The holding unit 33 holds the individual tray 34 carried in by the conveyance means. In this way, as illustrated in FIGS. 2 and 3, the trays 34 on which the workpiece W subjected to the film formation is mounted are all placed on the rotator 31.

The process of forming the film on the workpiece W introduced in the plasma processing apparatus 100 as described above is performed as follow. The following operation is an example in which one of the film formation unit 40 and one of the film processing unit 50 are activated, such as the film formation unit 40A only or the film processing unit 50A only, to perform film formation and film processing. However, the multiple film formation units 40 and film processing units 50 may be activated to increase the processing rate. In addition, the example film formation by the film formation unit 40 and film processing by the film processing unit 50 are to form the film of silicon oxynitride. As for the formation of the silicon oxynitride film is performed by repeating a process of impregnating oxygen ions and nitrogen ions while circulating and carrying the workpiece W every time silicon is stuck on the workpiece W in an atomic order.

First, the vacuum chamber 21 is always exhausted and depressurized by the discharge unit 23. When the vacuum chamber 21 reaches predetermined pressure, as illustrated in FIGS. 2 and 3, the rotator 31 starts rotating. Hence, the workpiece W held by the holding unit 33 moves along the conveyance path T, and passes through the lower spaces of the film formation units 40A, 40B, and 40C and the film processing units 50A and 50B. When the rotator 31 reaches a predetermined rotating speed, the gas supply unit 25 of the film formation unit 40 will supplies the sputter gas G1 around the target 41. At this time, the supply unit 53 of the film processing unit 50 also supplies the process gas G2 to the gas space R.

In the film formation unit 40, the power supply 6 applies the power to each target 41A, 41B, and 41C. Hence, the plasma sputter gas G1 is generated. In the sputter source 4, the active species like the ions that are produced by plasma collide with the target 41, and the particles of the film formation material are beaten out from the target 41. Hence, the particles of the film formation material are deposited on the surface of the workpiece W that passes through the film formation unit 40 every time the workpiece W passes through, and thus a film is formed. In this example, a silicon film is formed.

The power applied to each target 41A, 41B, and 41C by the power supply 6 is set in the memory unit 74 so as to increase sequentially from the inner circumference side of the rotator 31 toward the outer circumference side. The power supply control unit 72 outputs instructions to the power supply 6 so as to apply the controlled power to each target 41 in accordance with the power set in the memory unit 74. Because of such a control, the film formation amount by sputtering per a unit time increases from the inner circumference side toward the outer circumference side, but the passing speed of the rotator 31 increases from the inner circumference side toward the outer circumference side. Consequently, the film thickness across the whole workpiece W becomes uniform.

In addition, since film formation or film processing is not performed on the workpiece W even if the workpiece W passes through the deactivated film formation unit 40 and the deactivated film processing unit 50, the workpiece W is not heated in this case. Within the region where no heating is applied, the workpiece W releases heat. Note that the deactivated film formation units 40 are, for example, the film formation positions M4 and M5. In addition, the deactivated film processing unit 50 is, for example, the film processing position M3.

The workpiece W having undergone the film formation passes through the position that faces the cylindrical body 51 in the processing unit 5. In the processing unit 5, as illustrated in FIGS. 4 and 9, oxygen and nitrogen that are the process gas G2 are supplied to the cylindrical body 51 via the supply port 512 from the supply unit 53, and a high frequency voltage is applied to the antenna 55 from the RF power supply 55*a*. Application of the high frequency voltage applies an electric field in the gas space R via the window member 52, and thus plasma is generated. The oxygen ions and the nitrogen ions that are produced by the generated plasma collide with the surface of the workpiece W having undergone the film formation, thus penetrating through the film formation material. The shielding plate 582 covers the outer edge of the opening Ho, thus shielding the plasma at the covering region. Hence, the plasma processing is performed within the region defined by the adjustment opening 58*a*.

Since the support 510 is cooled by the cooling part 56 even if the discharge power applied to the antenna 55 is increased, a temperature rise is suppressed. In addition, since the dispersing part 57 is also cooled by the cooling part 56, a temperature rise is also suppressed. The sheet 561 with a high thermal conductivity is provided and in contact between the support 510 and the cooling part 56, and the sheet 562 with a high thermal conductivity is provided and in contact between the dispersing part 57 and the cooling part 56. Hence, the heat of the support 510 and that of the dispersing part 57 are efficiently transferred to the cooling part 56.

In addition, the colliding oxygen ions and nitrogen ions by plasma increase the temperature of the dividing wall 58, but the dividing wall 58 is separated from the dispersing part 57 via the gap d (see FIG. 7), and thus such heat is not transferred to the dispersing part 57. Even if the dividing wall 58 is thermally deformed, such a deformation does not affect the dispersing part 57. In addition, the dividing wall 58 itself is cooled by the second cooling part 583. As described above, since the thermal deformation due to heating of the dividing wall 58, the dispersing part 57, and the support 510 is suppressed, the deformation and damage to the window member 52 are also prevented.

The flow volume per a unit time of the process gas G2 introduced from the supply port 512 is set in the memory unit 74. The gas control unit 73 outputs instructions so as to control the flow volume of the process gas G2 which flows through each pipe 53*a* by the adjusting unit 54 in accordance with the flow volume set in this memory unit 74.

Still further, as illustrated in FIG. 5, the process gas G2 supplied from the supply port 512 collides with the dispersing plate 57*a*, spreads horizontally along the vertical surface of the dispersing plate 57*a*, and flows in the gas space R from the upper edge of the dispersing plate 57*a*. Accordingly, since the process gas G2 is dispersed, the flow volume of the process gas G2 only near the supply port 512 does not increase excessively.

The rotator 31 keeps rotating during the film formation process as described above, and keeps circulating and carrying the trays 34 on which the workpiece W is mounted. Hence, by circulating the workpiece W and repeating the film formation and film processing, the silicon oxynitride film that is a chemical compound film is formed on the surface of the workpiece.

After a predetermined processing time at which the silicon oxynitride film becomes a desired film thickness elapses, the film formation unit 40 and the film processing unit 50 are deactivated. That is, application of the power to the target 41 by the power supply 6, supply of the process gas G2 from the supply port 512, application of the voltage by the RF power 55*a*, etc., are terminated.

As described above, after the process of forming the film completes, the tray 34 on which the workpiece W is mounted is positioned in sequence to the load lock unit 60 by the rotation of the rotator 31, and is ejected from the plasma processing apparatus 100 by the conveyance means.

[Action and Effect]

(1) The plasma processing apparatus 100 according to this embodiment includes the vacuum container 20 capable of achieving a vacuumed interior, the conveyance unit 30 that includes the rotator 31 provided in the vacuum container 20 and rotating with the workpiece W being mounted thereon, and circulates and carries the workpiece along the circular conveyance path by rotating the rotator 31, the cylindrical member H having the opening Ho at one end extended in the direction toward the conveyance path T in the vacuum container 20, the window member 52 provided at the cylindrical member H, and dividing the space between the gas space R where the process gas G2 is introduced in the vacuum container 20 and the exterior, and the antenna 55 installed near the window member 52 and outside the gas space R, and causing the process gas G2 in the gas space R to generate inductive coupling plasma for plasma processing on the workpiece W passing through the conveyance path T when power is applied.

In addition, the cylindrical member H is provided with the opening Ho, and the opposing part h that faces the rotator 31, and the dividing wall 58 is provided between the opposing part h and the rotator 31 so as not to contact the opposing part h and the rotator 31 and not to move relative to the vacuum container 20. The dividing wall 58 is provided with the adjustment opening 58*a* that is provided at the location that faces the opening Ho, and adjusting the range of the plasma processing.

Accordingly, an adverse effect by thermal deformation to the window member 52 that divides the space between the gas space R formed in the cylindrical member H and the exterior can be suppressed, and the gap between the gas space R and the workpiece W can be precisely adjusted. That is, since the dividing wall 58 is provided so as not to contact the opposing part h and the rotator 31 and not to move relative to the vacuum container 20, a uniform gap between the dividing wall 58 and the workpiece W can be achieved. In addition, since the cylindrical member H and the dividing wall 58 are separate components, thermal transfer from the dividing wall 58 to the cylindrical member H is suppressed, and a deformation of the window member 52 by thermal deformation of the cylindrical member H is suppressed.

According to this embodiment, for example, the width of the adjustment opening 58a decreases from the outer circumference side toward the inner circumference side in order to achieve the uniform processing rate at the inner circumference side of the rotator 31, and the outer circumference side thereof. Hence, the area of the part where the shielding plate 582 shields the plasma increases toward the inner circumference. When the shielding width increases, the area that absorbs the heat of plasma increases, and the temperature becomes higher at the inner circumference side. In this case, thermal deformation increases from the outer circumference side of the dividing wall 58 toward the inner circumference. When the dividing wall 58 is being fastened to the cylindrical member H, this nonuniform thermal deformation is transferred to the cylindrical member H, and thus a part that supports the window member 52 is distorted. This distortion is transferred to the window member 52, possibly damaging the window member 52. According to this embodiment, however, since the dividing wall 58 is separated from the cylindrical member H, such an occasion can be prevented.

(2) The plasma processing apparatus 100 includes the cooling part 56 that cools the opposing part h. Hence, an adverse effect of the heat of the opposing part h to the window member 52 is suppressed.

(3) The plasma processing apparatus 100 includes the cooling part 583 that cools the dividing wall 58. Hence, a thermal deformation of the dividing wall 58 is suppressed.

(4) The vacuum container 20 employs the separation structure, the cylindrical member H is provided on the ceiling 20a that is a separated part of the vacuum container 20, and the rotator 31 and the dividing wall 58 are provided on the inner bottom 20b that is the other separated part of the vacuum container 20. If the cylindrical member H and the dividing wall 58 employs an integral structure (cylindrical member H'), when the ceiling 20a of the vacuum container 20 is opened, the cylindrical member H' is separated from the rotator 31. On the other hand, since the vacuum container 20 is sealed when the ceiling 20a is closed, the cylindrical member H' becomes invisible. This makes it difficult for the user to adjust and check the gap between cylindrical member H' and the rotator 31. According to this embodiment, however, since the gap between the dividing wall 58 and the rotator 31 is fixed regardless of the opening and closing of the ceiling 20a, facilitating the user to adjust and check the gap between the workpiece W and the dividing wall 58.

Figure 12:
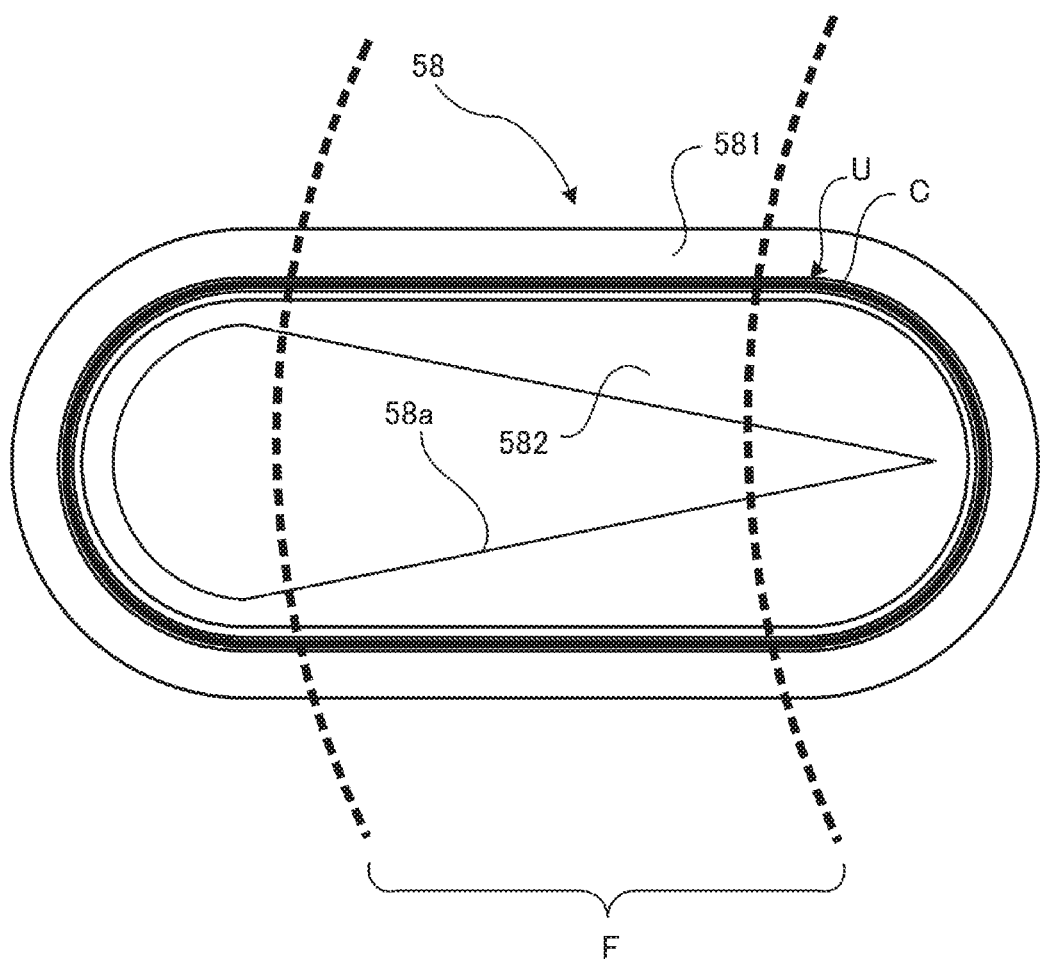
FIG. 12 is a plan view illustrating the dividing wall provided with a sealing member.
Figure 13:
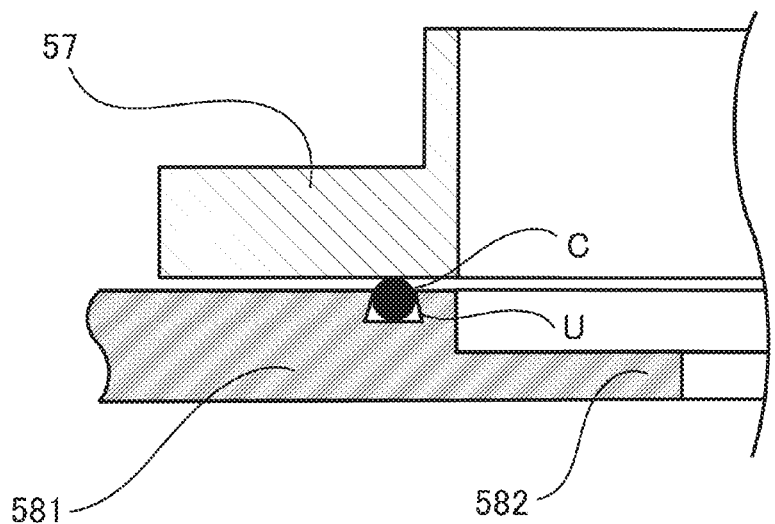
FIG. 13 is a partial cross-sectional view illustrating an example in which the sealing member is provided between the dispersing part and the dividing wall.

Modified Example (1) As illustrated in FIGS. 12 and 13, the space between the dividing wall 58 and the opposing part h may be sealed by a sealing member C. For example, a recess (dovetail groove) U may be formed in the opposing surface of the dividing wall 58 to the dispersing part 57 and across the entire circumference of the adjustment opening 58a. An O-ring that is the endless sealing member C may be fitted in this recess U. In addition, the sealing member C is caused to contact the bottom of the dispersing part 57. This gas-tightly seals the space between the dividing wall 58 and the dispersing parts 57, thus maintaining the pressure of the gas space R. In addition, this prevents the process gas G2 from being dispersed to the film formation unit 40. As for the sealing member C, a shield finger may be applied. This secures the electrical conductivity while gas-tightly sealing the space between the dividing wall 58 and the dispersing part 57, surely grounding the dividing wall 58.

Figure 14:
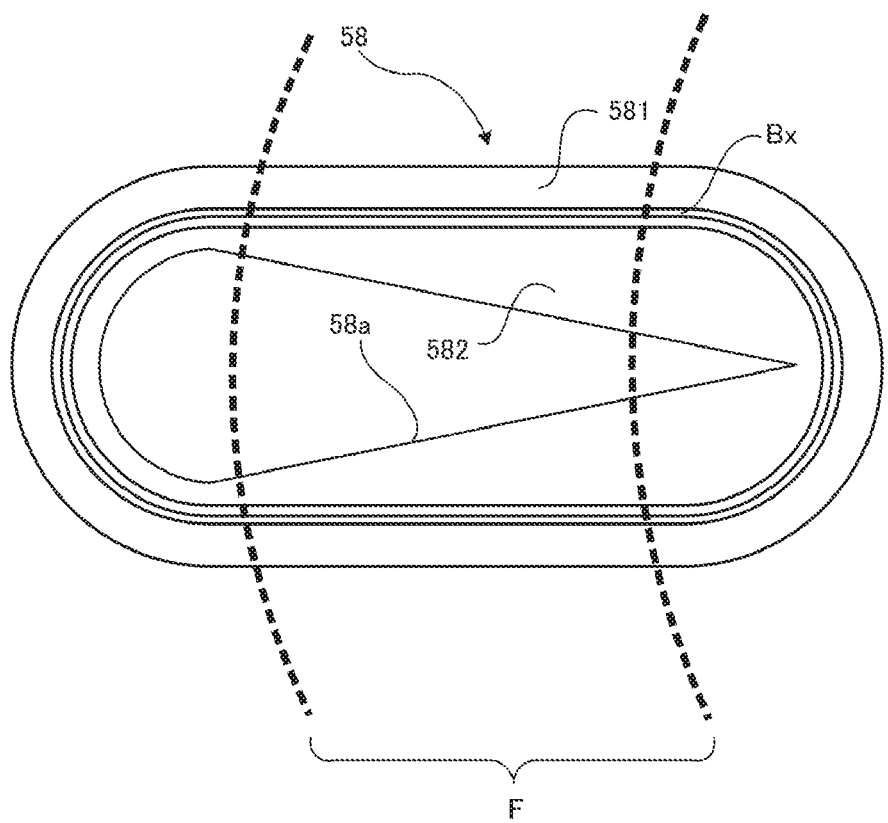
FIG. 14 is a plan view illustrating the dividing wall provided with a recess.
Figure 15:
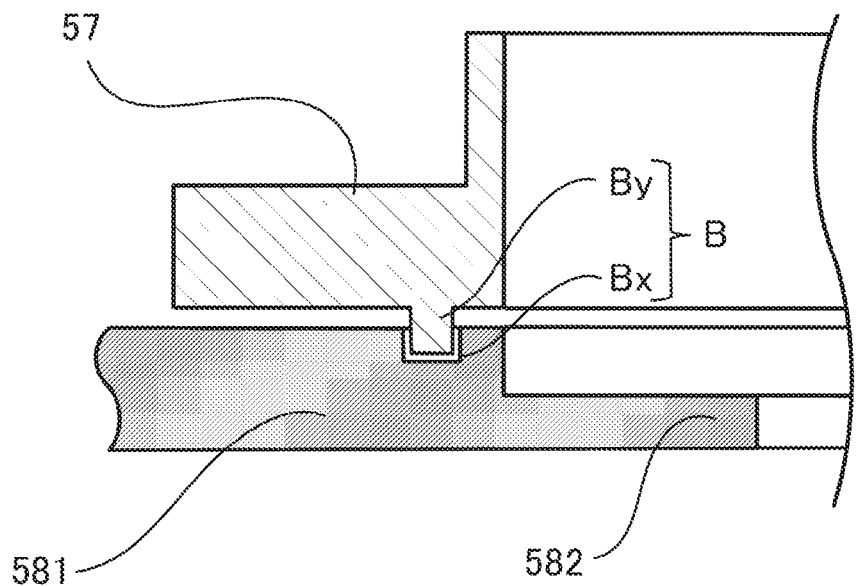
FIG. 15 is a partial cross-sectional view of a labyrinth structure between the dispersing part and the dividing wall.
Figure 16:
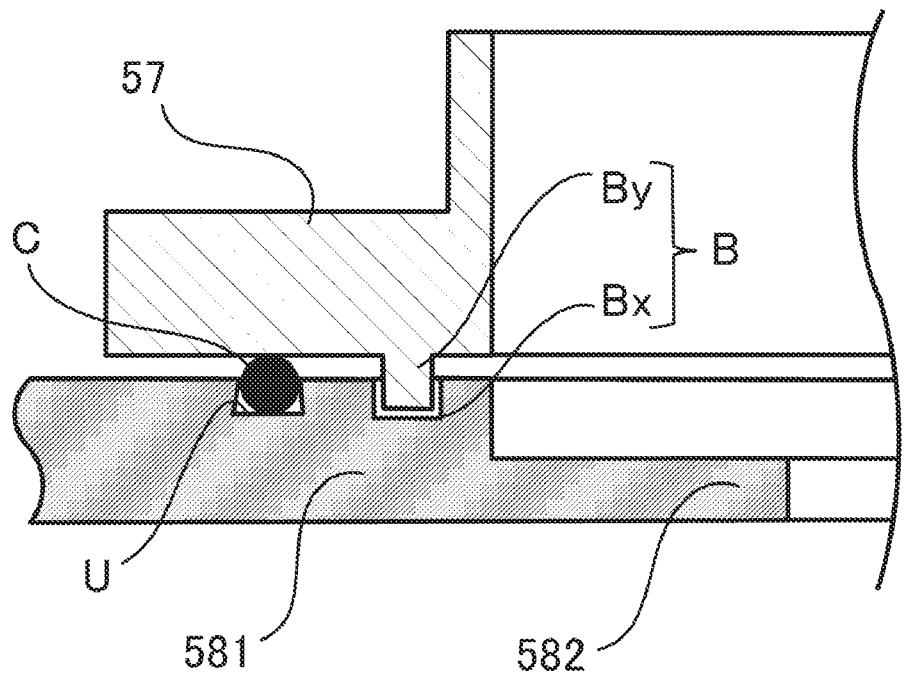
FIG. 16 is a partial cross-sectional view of the sealing member and the labyrinth structure both provided between the dispersing part and the dividing wall.

(2) As illustrated in FIGS. 14 and 15, a labyrinth structure B that is a combination of non-contact concavities and convexities may be provided between the dividing wall 58 and the opposing part h. For example, a concavity Bx that is an annular groove is formed in an opposing surface of the dividing wall 58 to the dispersing part 57. Next, a convexity by that enters the concavity Bx in a non-contact manner is formed in the dispersing part 57. Accordingly, the flow pass between the dividing wall 58 and the dispersing part 57 is deflected, making it difficult for the process gas G2 to flow out, thus maintaining the pressure of the gas space R. The number of the combination of such concavities and convexities, the dimension, etc., are not limited to this example. In addition, as illustrated in FIG. 16, the above sealing member C of (1) may be provided, and the labyrinth structure B may be also employed. This further surely maintains the pressure of the gas space R. In this case, in order to prevent the sealing member C from being exposed to and damaged by plasma, the sealing member C may be provided at the outer circumference side of the labyrinth structure B. This sealing member C may be an O-ring or a shield finger.

Figure 17A:
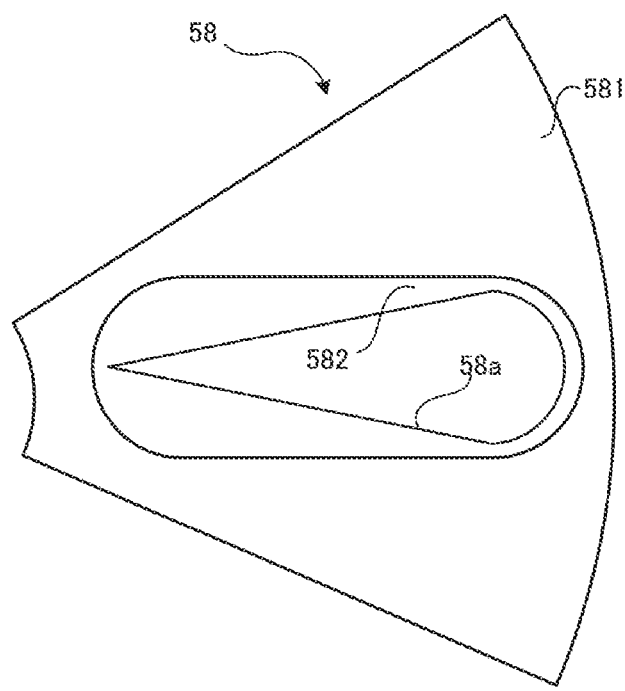
FIGS. 17A and 17B are each a plan view illustrating a modified example of the dividing wall.
Figure 17B:
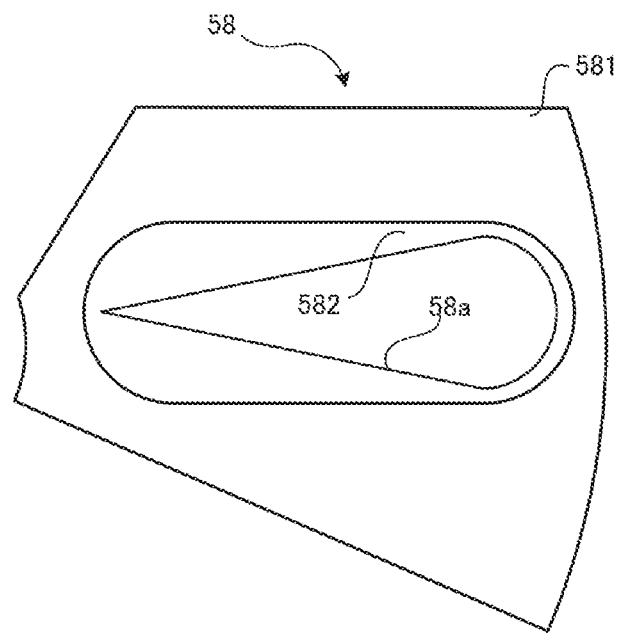

(3) The external shape of the dividing wall 58 may be larger than the external shape of the cylindrical body 51. For example, as illustrated in FIG. 17 (A), the base body 581 may be a sector, or as illustrated in FIG. 17 (B), the base body 581 may be a polygon. In comparison with a case in which the base body is in the same cylindrical shape as the cylindrical member H, the conductance of the gap between the rotator 31 and the dividing wall 58 can be reduced.

Figure 18:
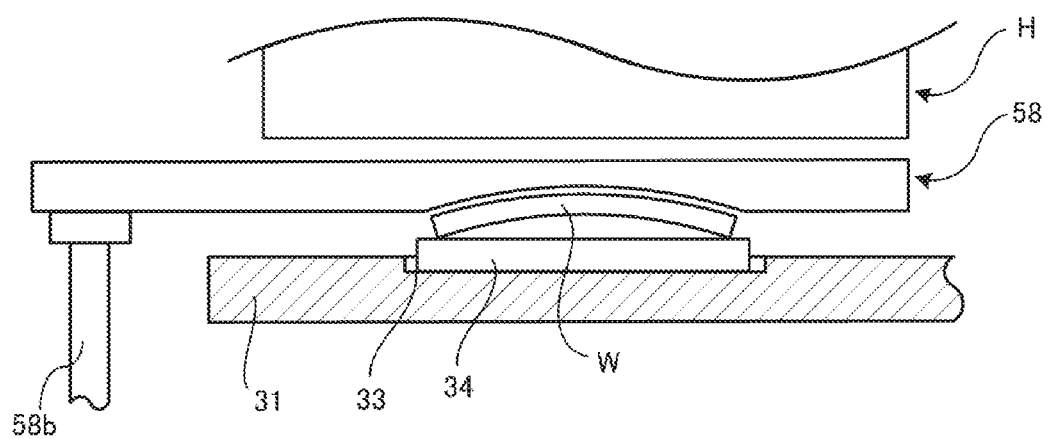
FIG. 18 is a partial cross-sectional view illustrating a modified example of the dividing wall.

(4) A shape that matches the process surface of the workpiece W in a non-contact manner may be formed on the opposing surface of the dividing wall 58 to the rotator 31. For example, as illustrated in FIG. 18, the lower surface of the dividing wall 58 may be curved along the shape of the workpiece W curved as a convexity. In addition, the lower surface of the dividing wall 58 may be curved along the shape of the workpiece W curved as a concavity. This decreases the gap between the dividing wall 58 and the rotator 31 when the workpiece W is located right under the dividing wall 58, suppressing a pressure reduction due to the leakage of the process gas G2. Still further, when the multiple workpieces W are mounted with a narrow clearance therebetween, the next workpiece W comes immediately after the one workpiece W has passed through, and the gap between the dividing wall 58 and the rotator 31 is decreased in sequence, further suppressing the leakage of the process gas G2.

Other Embodiments

The present disclosure is not limited to the above embodiment, and also covers the following configurations.

(1) An RF power may be applied to the dividing wall except a case in which the shield finger is applied.

(2) As for the film formation material, various materials capable of forming a film by sputtering are applicable. For example, tantalum, titanium, aluminum, etc., are applicable. Various materials are also applicable to the material for forming a chemical compound.

(3) The number of the targets in the film formation unit is not limited to three. The number of targets may be one, two, or equal to or greater than four. When the number of targets is increased and the applied power to each target is adjusted, a control for a further fine film thickness is enabled. In addition, the number of film formation units may be one, two or equal to or greater than four. When the number of film formation units is increased, the film formation rate can be increased. In accordance with the increased number of film formation units, when the number of film processing units is increased, the film processing rate can be also increased.

(4) The film formation by the film formation unit is not always necessary, and the film formation unit may be omitted. That is, the present disclosure is not limited to the plasma processing apparatus that performs film processing, but is applicable to plasma processing apparatuses that process an object to be processed using the active species produced by plasma. For example, a plasma processing apparatus that generates plasma in the gas space of the processing unit, and performs surface reformation, such as etching and ashing, and cleaning may be achieved. In this case, for example, an inactive gas like argon may be applied as the process gas.

(5) The shape of the cylindrical body and that of the window member and also that of the antenna are not limited to the example shape as described above. A horizontal cross-section in a square, circular, or elliptical shape may be employed.

(6) The number of the trays and workpieces simultaneously carried by the conveyance unit, and the number of the holding units that hold those may be at least one, and are not limited to the numbers described in the above embodiment. That is, a configuration in which the one workpiece W is circulated and carried is adoptive, and a configuration in which equal to or greater than two workpieces W are circulated and carried is also adoptive. A configuration in which the workpieces W that are aligned in equal to or greater than two lines in the radial direction are circulated and carried is also adoptive.

(7) In the above embodiment, although the rotator is the rotation table, the rotator is not limited to table. The rotator may be a rotation body that holds the tray and the workpiece on the arm extended radially from the rotation center, and rotates together with such an arm. The film formation unit and the film processing unit may be located at the bottom side of the vacuum container, and the positional relationship in the vertical direction between the film formation unit and the film processing unit, and, the rotator may be inverted. In this case, the surface of the rotator on which the holding unit is installed becomes the surface directed downwardly when the rotator is in the horizontal direction, i.e., the lower surface.

(8) Although the embodiment of the present disclosure and the modifications of each component have been described above, such embodiment and the modifications of each component are merely presented as examples, and are not intended to limit the scope of the present disclosure. The above described novel embodiments can be carried out in other various forms, and various omissions, replacements, and modifications can be made thereto without departing from the scope of the present disclosure. Such embodiment and modifications thereof are within the scope of the present disclosure, and are also within the scope of the invention as recited in the appended claims.

What is claimed is:

1. A plasma processing apparatus comprising:
   a vacuum container capable of achieving a vacuumed interior, the vacuum container containing at least one film formation unit and at least one film processing unit;
   a conveyance unit including a rotator provided in the vacuum container and mounting a workpiece on a surface thereof, an axis extending in a direction perpendicular to the surface of the rotator, wherein the conveyance unit is configured to circulate the rotator around the axis and carry the workpiece along a circular conveyance path between the at least one film formation unit and the at least one film processing unit;
   the at least one film formation unit comprising at least one target for sputtering onto the workpiece;
   the at least one film processing unit comprising a cylindrical member having an opening at one end that extends into the vacuum container in a direction toward the circular conveyance path in the vacuum container;
   a window member within the vacuum container and provided at the opening at the one end of the cylindrical member, and dividing a gas space between an interior of the cylindrical member and the rotator from an exterior; and
   an antenna installed facing the window member and outside the gas space, and causing process gas introduced in the gas space to generate inductive coupling plasma for plasma processing on the workpiece passing through the circular conveyance path when power is applied to the antenna,
   wherein:
   the cylindrical member is provided with an opposing part that is provided with the opening and faces the rotator;
   a dividing wall is supported by the vacuum container and is provided between the opposing part and the rotator so as not to contact the opposing part and the rotator and not to move relative to the opposing part;
   the dividing wall has a shielding plate at a location that faces the opening, the shielding plate having an adjustment opening adjusting a range of the plasma processing, wherein the shielding plate comprises a flat plate covering the opening,
   wherein a width of the adjustment opening decreases from an outer circumference side of the rotator toward an inner circumference side of the rotator, and
   wherein an area of a part of the shielding plate that shields the plasma increases from the outer circumference side of the rotator toward the inner circumference side of the rotator.

2. The plasma processing apparatus according to claim 1, wherein a space between the dividing wall and the opposing part is gas-tightly sealed by a sealing member.

3. The plasma processing apparatus according to claim 1, wherein a space between the dividing wall and the opposing part employs a labyrinth structure that is a combination of non-contact concavities and convexities.

4. The plasma processing apparatus according to claim 1, wherein a surface of the dividing wall that faces the rotator is formed in a shape matching a process surface of the workpiece in a non-contact manner.

5. The plasma processing apparatus according to claim 1, wherein an external shape of the dividing wall is greater than an external shape of the cylindrical member.

6. The plasma processing apparatus according to claim 1, further comprising a first cooling part that cools the opposing part.

7. The plasma processing apparatus according to claim 1, further comprising a second cooling part that cools the dividing wall.

8. The plasma processing apparatus according to claim 1, wherein:
 the vacuum container employs a separation structure;
 the cylindrical member is provided at a separated part of the vacuum container; and
 the rotator and the dividing wall are provided at another separated part of the vacuum container.

9. The plasma processing apparatus according to claim 4, wherein a curved shape that matches the curved shape of the workpiece is formed on a surface of the dividing wall that faces the rotator.

10. The plasma processing apparatus according to claim 2, wherein a space between the dividing wall and the opposing part employs a labyrinth structure that is a combination of non-contact concavities and convexities.

11. The plasma processing apparatus according to claim 10, wherein an external shape of the dividing wall is greater than an external shape of the cylindrical member.

12. The plasma processing apparatus according to claim 10, wherein a surface of the dividing wall that faces the rotator is formed in a shape matching a process surface of the workpiece in a non-contact manner.

13. The plasma processing apparatus according to claim 11, wherein a surface of the dividing wall that faces the rotator is formed in a shape matching a process surface of the workpiece in a non-contact manner.

14. The plasma processing apparatus according to claim 13, wherein a curved shape that matches the curved shape of the workpiece is formed on a surface of the dividing wall that faces the rotator.

* * * * *